United States Patent
Kondo

(10) Patent No.: US 10,950,622 B2
(45) Date of Patent: Mar. 16, 2021

(54) SEMICONDUCTOR MEMORY DEVICE

(71) Applicant: Toshiba Memory Corporation, Tokyo (JP)

(72) Inventor: Masaki Kondo, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/290,456

(22) Filed: Mar. 1, 2019

(65) Prior Publication Data
US 2020/0091177 A1 Mar. 19, 2020

(30) Foreign Application Priority Data

Sep. 19, 2018 (JP) .............................. JP2018-175312

(51) Int. Cl.
| H01L 21/00 | (2006.01) |
| H01L 27/11582 | (2017.01) |
| H01L 27/11565 | (2017.01) |
| G11C 16/10 | (2006.01) |
| G11C 16/04 | (2006.01) |
| H01L 29/08 | (2006.01) |
| H01L 21/02 | (2006.01) |
| H01L 21/027 | (2006.01) |

(Continued)

(52) U.S. Cl.
CPC .... *H01L 27/11582* (2013.01); *G11C 16/0483* (2013.01); *G11C 16/10* (2013.01); *H01L 27/11565* (2013.01); *H01L 29/0847* (2013.01); H01L 21/0217 (2013.01); H01L 21/0223 (2013.01); H01L 21/0228 (2013.01); H01L 21/0262 (2013.01); H01L 21/0274 (2013.01); H01L 21/02164 (2013.01); H01L 21/02178 (2013.01); H01L 21/02271 (2013.01); H01L 21/02636 (2013.01); H01L 21/28568 (2013.01); H01L 21/31111 (2013.01); H01L 21/31116 (2013.01); H01L 29/401 (2013.01); H01L 29/40117 (2019.08)

(58) Field of Classification Search
CPC ......... H01L 27/11582; H01L 27/11565; G11C 16/10
See application file for complete search history.

(56) References Cited

U.S. PATENT DOCUMENTS

| 8,436,414 B2 * | 5/2013 | Tanaka | ............... H01L 27/11582 257/324 |
| 8,748,971 B2 * | 6/2014 | Tanaka | .................. H01L 29/792 257/324 |

(Continued)

Primary Examiner — Laura M Menz
(74) Attorney, Agent, or Firm — Kim & Stewart LLP

(57) ABSTRACT

A semiconductor memory device includes first conductive layers stacked and second conductive layers stacked in a first direction. The second conductive layers spaced from the first conductive layers in a second direction intersecting the first direction. A first memory pillar is between the first conductive layers and the second conductive layers in the second direction. The first memory pillar extends in the first direction and has a first length in the second direction. A second memory pillar is between the first conductive layers and the second conductive layers in the second direction. The second memory pillar is adjacent to the first memory pillar. The second memory pillar extends in the first direction and has a second length greater than the first length in the second direction.

11 Claims, 40 Drawing Sheets

(51) Int. Cl.
*H01L 21/311* (2006.01)
*H01L 21/285* (2006.01)
*H01L 29/40* (2006.01)
*H01L 21/28* (2006.01)

(56) References Cited

U.S. PATENT DOCUMENTS

| | | | | |
|---|---|---|---|---|
| 8,873,266 | B2 * | 10/2014 | Okamoto | G11C 7/02 |
| | | | | 365/53 |
| 9,673,216 | B1 * | 6/2017 | Baraskar | H01L 29/40114 |
| 9,698,156 | B2 | 7/2017 | Lue | |
| 10,020,314 | B1 * | 7/2018 | Baraskar | H01L 27/11556 |
| 10,269,828 | B2 * | 4/2019 | Futatsuyama | H01L 27/11565 |
| 10,454,025 | B1 * | 10/2019 | Cheng | H01L 45/1233 |
| 2010/0207194 | A1 * | 8/2010 | Tanaka | H01L 27/11582 |
| | | | | 257/324 |
| 2012/0236652 | A1 * | 9/2012 | Okamoto | H01L 27/11521 |
| | | | | 365/185.18 |
| 2013/0228850 | A1 * | 9/2013 | Tanaka | H01L 27/11578 |
| | | | | 257/324 |
| 2015/0214235 | A1 * | 7/2015 | Lee | H01L 27/11517 |
| | | | | 257/316 |
| 2016/0284410 | A1 * | 9/2016 | Lee | G11C 16/0483 |
| 2017/0236779 | A1 * | 8/2017 | Komori | H01L 23/53266 |
| | | | | 257/326 |
| 2017/0263614 | A1 * | 9/2017 | Tokuhira | H01L 29/40117 |
| 2017/0330624 | A1 * | 11/2017 | Lim | G11C 5/025 |
| 2017/0338238 | A1 | 11/2017 | Zhang | |
| 2018/0240808 | A1 * | 8/2018 | Song | G11C 16/12 |
| 2018/0277565 | A1 * | 9/2018 | Futatsuyama | G11C 16/24 |
| 2019/0080772 | A1 * | 3/2019 | Yanagidaira | G11C 16/0483 |
| 2019/0081064 | A1 * | 3/2019 | Nakaki | G11C 16/0466 |
| 2019/0214406 | A1 * | 7/2019 | Futatsuyama | G11C 16/10 |
| 2019/0280000 | A1 * | 9/2019 | Nakamura | H01L 29/7883 |
| 2019/0287994 | A1 * | 9/2019 | Tanaka | H01L 27/11565 |
| 2019/0294495 | A1 * | 9/2019 | Takagiwa | G11C 29/025 |
| 2019/0296040 | A1 * | 9/2019 | Fujii | H01L 27/11582 |
| 2019/0333581 | A1 * | 10/2019 | Diep | H01L 27/11582 |
| 2020/0091175 | A1 * | 3/2020 | Maejima | G11C 16/32 |
| 2020/0091177 | A1 * | 3/2020 | Kondo | H01L 27/11565 |
| 2020/0091180 | A1 * | 3/2020 | Seki | H01L 27/11565 |
| 2020/0098432 | A1 * | 3/2020 | Shirakawa | G11C 16/3459 |
| 2020/0176061 | A1 * | 6/2020 | Maejima | G11C 16/14 |

* cited by examiner

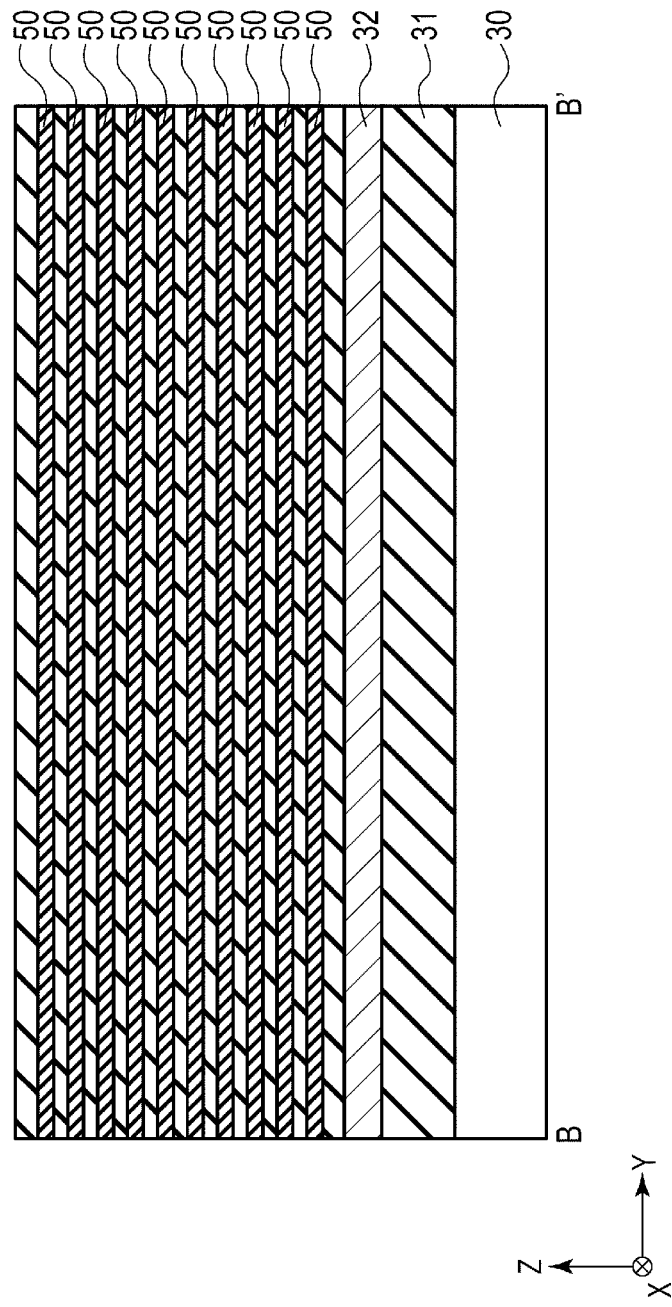

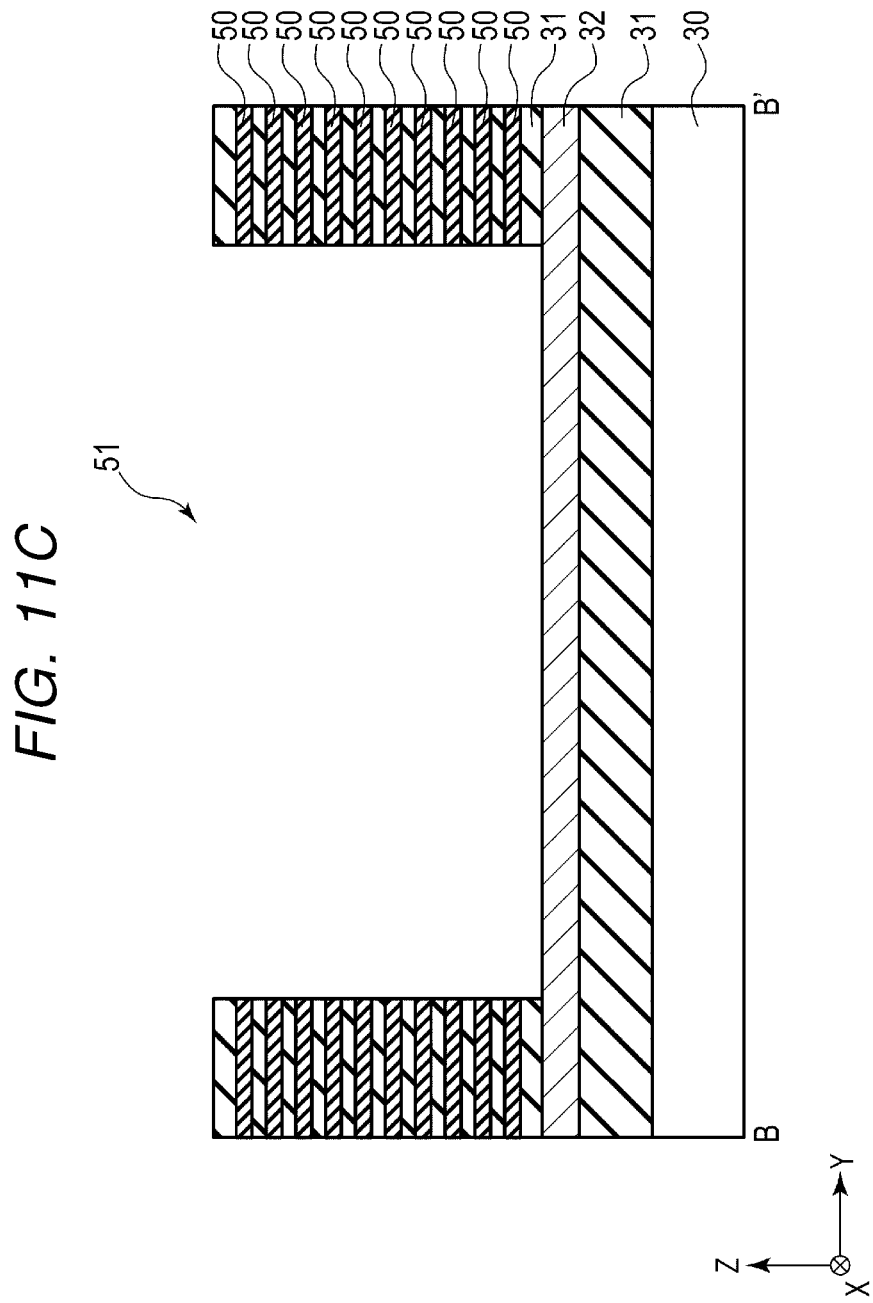

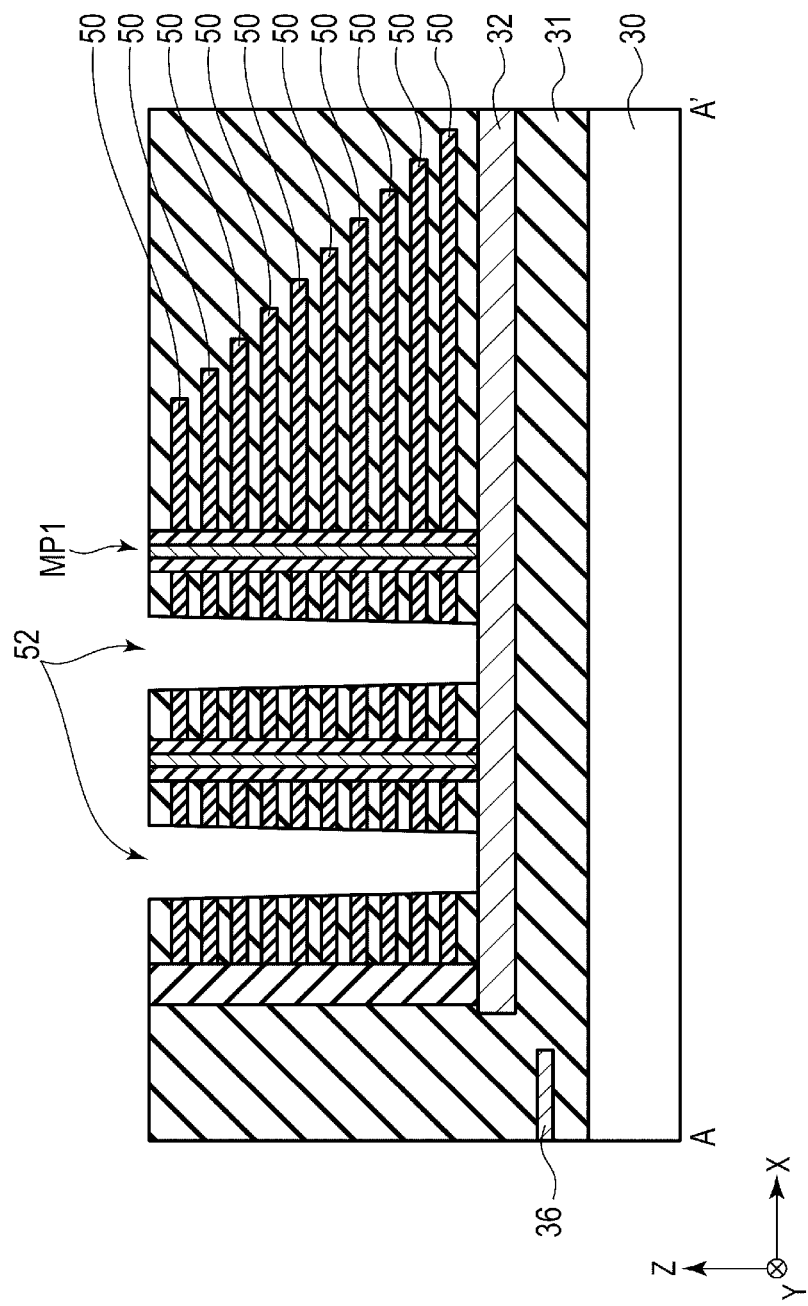

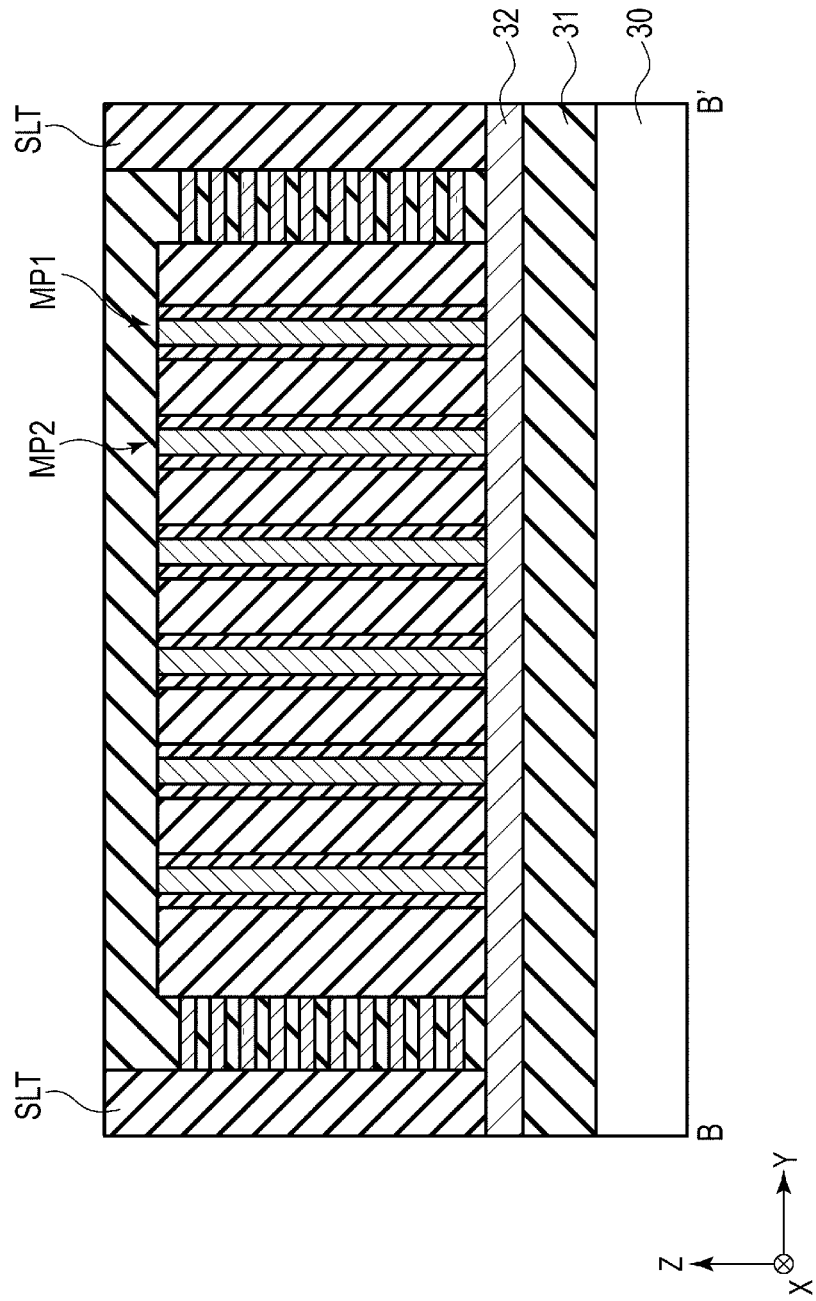

SEMICONDUCTOR MEMORY DEVICE

CROSS-REFERENCE TO RELATED APPLICATIONS

This application is based upon and claims the benefit of priority from Japanese Patent Application No. 2018-175312, filed Sep. 19, 2018, the entire contents of which are incorporated herein by reference.

FIELD

Embodiments described herein relate generally to a semiconductor memory device.

BACKGROUND

Semiconductor memory devices in which memory cells are three-dimensionally arranged are known.

DESCRIPTION OF THE DRAWINGS

FIG. 10C is a cross-sectional view taken along line B-B' in FIG. 10B of a structure formed in manufacturing a semiconductor memory device according to an embodiment.

FIG. 11C is a cross-sectional view taken along line B-B' in FIG. 11A of a structure formed in of manufacturing a semiconductor memory device according to the embodiment.

FIG. 13B is a cross-sectional view taken along line A-A' in FIG. 13A of a structure formed in manufacturing a semiconductor memory device according to an embodiment.

FIG. 17C is a cross-sectional view taken along line B-B' in FIG. 17A of a structure formed in manufacturing a semiconductor memory device according to an embodiment.

DETAILED DESCRIPTION

Figure 1:
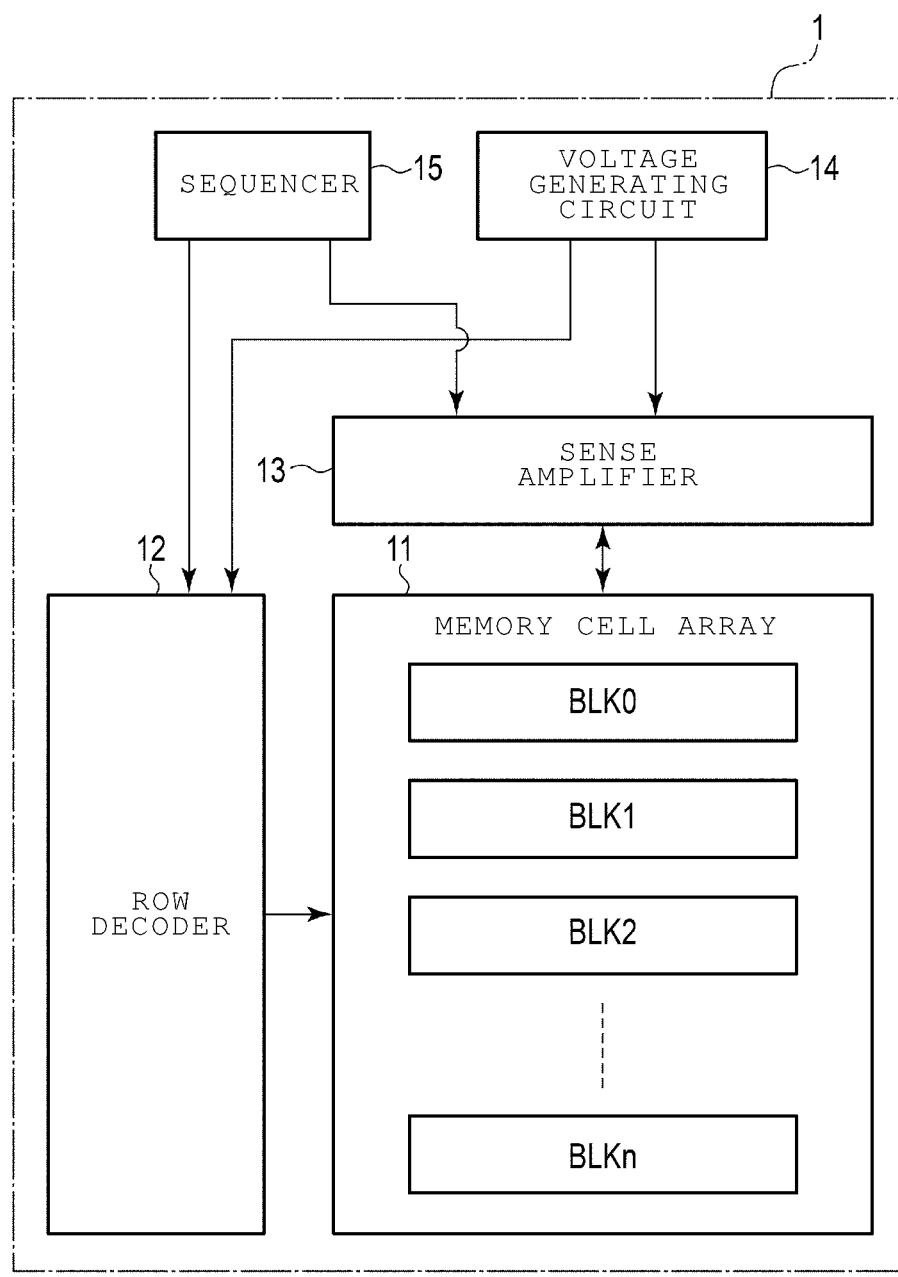
FIG. 1 is a schematic diagram of a semiconductor memory device according to an embodiment.

In general, according to one embodiment, a semiconductor memory device comprises a plurality of first conductive layers stacked in a first direction and a plurality of second conductive layers stacked in the first direction and spaced from the plurality of first conductive layers in a second direction intersecting the first direction. A first memory pillar is between the first conductive layers and the second conductive layers in the second direction. The first memory pillar extends in the first direction and has a first length in the second direction. A second memory pillar is between the first conductive layers and the second conductive layers in the second direction. The second memory pillar is adjacent to the first memory pillar, extends in the first direction, and has a second length greater than the first length in the second direction.

Hereinafter, example embodiments will be described with reference to the drawings. In the following description, the same reference numerals are used to denote components having the same or substantially similar functions and configurations. In addition, each of the example embodiments set forth herein provides an example of a device or a method for embodying particular technical concepts thereof, and as such various details related materials, specific shapes, structures, positional arrangements, and the like for components are not limited to the following description of specific examples.

When a controller or control unit is described in terms of functional blocks/units, such functional blocks/units can be realized by either one of hardware circuitry or computer software, or a combination of the two. Furthermore, variations in delineation of functional blocks/units are possible such delineations or groupings of functional aspects are not necessarily limited to the identification of blocks/units in examples described below. For example, some functions may be performed or considered to be performed by a functional block different from the functional blocks described herein. Furthermore, the functional blocks described herein may be divided into a plurality of functional sub-blocks.

A three-dimensional stacked type NAND flash memory in which memory cell transistors are stacked in a plurality of layers on an upper surface of a semiconductor substrate will be described as one possible example of a nonvolatile semiconductor memory device.

1. Structure of Semiconductor Memory Device

First, an overall configuration of the semiconductor memory device according to the embodiment will be described. FIG. 1 is a block diagram illustrating a configuration of the semiconductor memory device according to the embodiment. Although some particular connections between the depicted functional blocks in FIG. 1 are indicated by an arrow, the connections between the various functional blocks are not limited to those specifically depicted in FIG. 1.

As illustrated in FIG. 1, a semiconductor memory device 1 includes a memory cell array 11, a row decoder 12, a sense amplifier 13, a voltage generating circuit 14, and a sequencer 15.

1. 1 Configuration of Each Memory Block

The memory cell array 11 includes a plurality of blocks BLK0, BLK1, BLK2 . . . BLKn (Here, n represents an integer greater than or equal to 0). Description referring to a block BLK should be understood to refer to any one of the blocks BLK0 to BLKn in an undifferentiated manner (that is, such description concerns all the blocks BLK). Each block BLK includes a plurality of memory cell transistors three-dimensionally arranged and in connection with wirings extending in a row direction and a column direction.

The row decoder 12 decodes a row address received from an external controller. The row decoder 12 selects one of the blocks BLK based on a result of decoding the row address and further selects a word line of the selected block BLK. Specifically, a voltage is applied to various wirings for selecting a word line.

During a data read operation, the sense amplifier 13 senses data read from the blocks BLK and performs operations required thereafter. During a data write operation, the sense amplifier 13 transmits a voltage corresponding to write data to the memory cell array 11.

The voltage generating circuit 14 generates various voltages necessary for a write operation, a read operation, or an erasing operation, and supplies these voltages to the row decoder 12, the sense amplifier 13, and the like.

The sequencer 15 controls overall operations of the semiconductor memory device 1. In more detail, the sequencer 15 controls the voltage generating circuit 14, the row decoder 12, the sense amplifier 13, and the like when the write operation, the read operation, and the erasing operation are performed according to a command given from an external controller.

1. 2 Circuit Configuration of Memory Cell Array 11

As described above, the memory cell array 11 includes the blocks BLK0 to BLKn. The blocks BLK0 to BLKn each have the same internal configuration.

Figure 2:
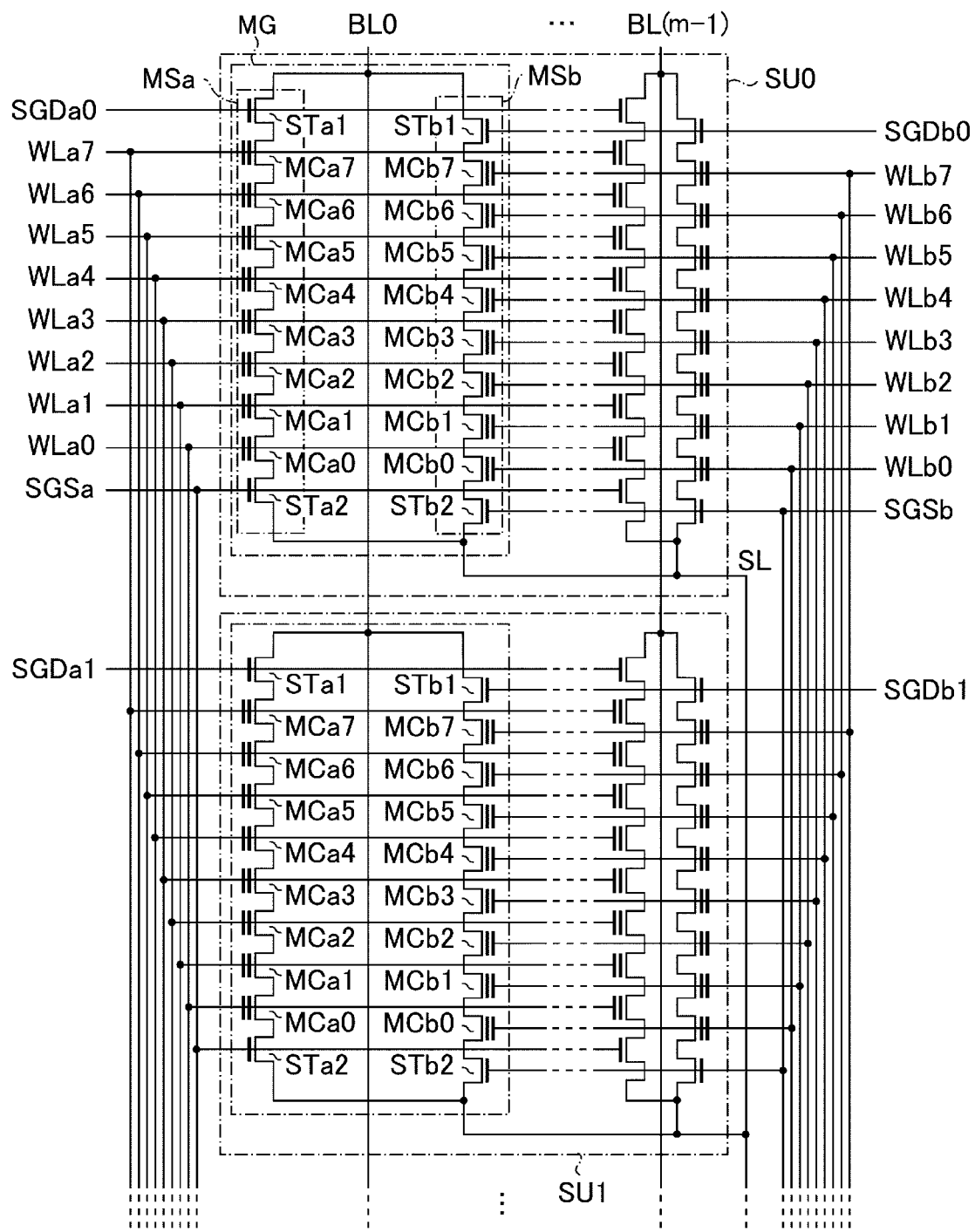
FIG. 2 is a circuit diagram of a block in a memory cell array according to an embodiment.

FIG. 2 is a circuit diagram of a block BLK in the memory cell array 11. The block BLK includes a plurality of string units SU0, SU1, etc. Any reference to a string unit SU should be understood to refer to any one of the plurality of string units. The string unit SU includes a plurality of memory groups MG. Each of the memory groups MG includes two memory strings MSa and MSb connected to each other in parallel. When the memory strings MSa and MSb need not be distinguished from each other, the memory strings MSa and MSb will be referred to as memory strings MS for simplicity.

The memory string MSa includes, for example, eight memory cell transistors MCa0 to MCa7 (also referred to as memory cells for simplicity in some contexts), and selection transistors STa1 and STa2. Similarly, the memory string MSb includes, for example, eight memory cell transistors MCb0 to MCb7 (also referred to as memory cells for simplicity in some contexts), and selection transistors STb1 and STb2. Hereinafter, in description in which the memory cell transistors MCa0 to MCa7 and MCb0 to MCb 7 need not be distinguished from each other, the memory cell transistors MCa0 to MCa7 and MCb0 to MCb 7 may be referred to as memory cell transistors MC or memory cells MC. Also, when the selection transistors STa1 and STb1 need not be distinguished from each other, the selection transistors STa1 and STb1 may both be referred to as selection transistors ST1. Similarly, when the selection transistors STa2 and STb2 need not be distinguished from each other, they may be referred to as selection transistors ST2.

The memory cell transistors MC include a control gate and a charge storage layer to store data in a nonvolatile manner. The memory cell transistors MC may be a MONOS-type (metal-oxide-nitride-oxide-semiconductor) using an insulating layer for the charge storage layer, or may be an FG-type (floating gate) using a conductive layer for the charge layer. In the current example embodiment, a MONOS-type will be described.

In addition, the number of memory cell transistors MC in each memory string MS may be 16, 32, 48, 64, 96, 128 or the like, and is not particularly limited. Furthermore, the number of selection transistors ST1 and the number of selection transistors ST2 in each of the memory strings MS may be any numbers if the numbers are equal to or more than one.

The memory cell transistors MC and the selection transistors ST1 and ST2 in the memory string MS are connected to each other in series. Specifically, in the memory string MSa, the respective current paths are sequentially connected in series to one another of the selection transistor STa2, the memory cell transistors MCa0 to MCa7, and the selection transistor STa1. Similarly, in the memory string MSb, the respective current paths are sequentially connected in series to one another of the selection transistor STb2, the memory cell transistors MCb0 to MCb7, and the selection transistor STb1.

A drain of the selection transistor STa1 and a drain of the selection transistor STb1, which are provided in each memory group MG, are connected to one of the bit lines BL0 . . . BL(m−1) (here, (m−1) represents an integer greater than or equal to 2).

References to a bit line BL will be hereinafter understood to indicate any of the bit lines BL0 to BL(m−1). Each bit line BL is controlled independently by the sense amplifier 13. In addition, a source of the selection transistor STa2 and a source of the selection transistor STb2, which are provided in each memory group MG, are both connected to a source line SL.

Gates of the selection transistors STa1 in each string unit SU are connected to a respective selection gate line SGDa (SGDa0, SGDa1, etc.). Gates of the selection transistors STb1 in each string unit SU are connected to a respective selection gate line SGDb (SGDb0, SGDb1, etc.). Specifically, in the string unit SU0, the gates of the selection transistors STa1 are connected to the selection gate line SGDa0 and the gates of the selection transistors STb1 are connected to the selection gate line SGDb0. Similarly, in the string unit SU1, the gates of the selection transistors STa1 are connected to the selection gate line SGDa1, and the gates of the selection transistors STb1 are connected to the selection gate line SGDb1. Hereinafter, when the selection gate lines SGDa and SGDb need not be distinguished from each other, the selection gate lines SGDa and SGDb will be referred to as selection gate lines SGD. Each of the selection gate lines SGD is independently controlled by the row decoder 12.

Within the same block BLK, gates of the selection transistors STa2 are connected to a selection gate line SGSa, and gates of the selection transistors STb2 are to a selection gate line SGSb. The selection gate lines SGSa and SGSb may be, for example, controlled together by the row decoder 12, or may be controlled independently by the row decoder 12. Hereinafter, when the selection gate lines SGSa and SGSb need not be distinguished from each other, the selection gate lines SGSa and SGSb will be referred to as a selection gate line SGS.

Within the same block BLK, control gates of the memory cell transistors MCa0 to MCa7 are respectively connected to word lines WLa0 to WLa7 shared within the block BLK, and control gates of the memory cell transistors MCb0 to MCb7 are respectively connected to word lines WLb0 to WLb7 shared within the block BLK. The word lines WLa0 to WLa7 and WLb0 to WLb7 are independently controlled by the row decoder 12. References to word lines WLa should be understood to refer to each of the word lines WLa0 to WLa7, and references to word lines WLb should be understood to refer to each of the word lines WLb0 to WLb7. Furthermore, when the word lines WLa and WLb need not be distinguished from each other in the description, these word lines WLa and WLb may be referred to as word lines WL for simplicity.

Each block BLK corresponds to, for example, the minimum operational unit size for a data erase operation. That is, when data is to be erased, all the memory cell transistors MC within the same block BLK are erased at once in the data erase operation. Write operations the read operations are performed on memory cell transistors MC connected to one word line WL of one string unit SU. This data unit for read and write operations may be referred to as a page unit in some contexts.

In the memory cell array 11, the drains of the selection transistors STa1 and the drains of the selection transistors STb1 belonging to a plurality of memory groups MG arranged in the same column are connected to one of the bit lines BL. That is, the bit line BL commonly connects one memory group MG in each string unit SU. The string unit SU includes a plurality of memory groups MG connected to different bit lines BL and connected to the same selection gate line SGD.

In addition, the block BLK includes a plurality of string units SU that share the word lines WL. The memory cell array 11 includes a plurality of blocks BLK that share the bit lines BL. In the memory cell array 11, the memory cell transistors MC are three-dimensionally arranged by stacking the selection gate line SGS, the word lines WL, and the selection gate lines SGD above the semiconductor substrate.

1. 3 Planar Configuration of Memory Cell Array 11

Figure 3:
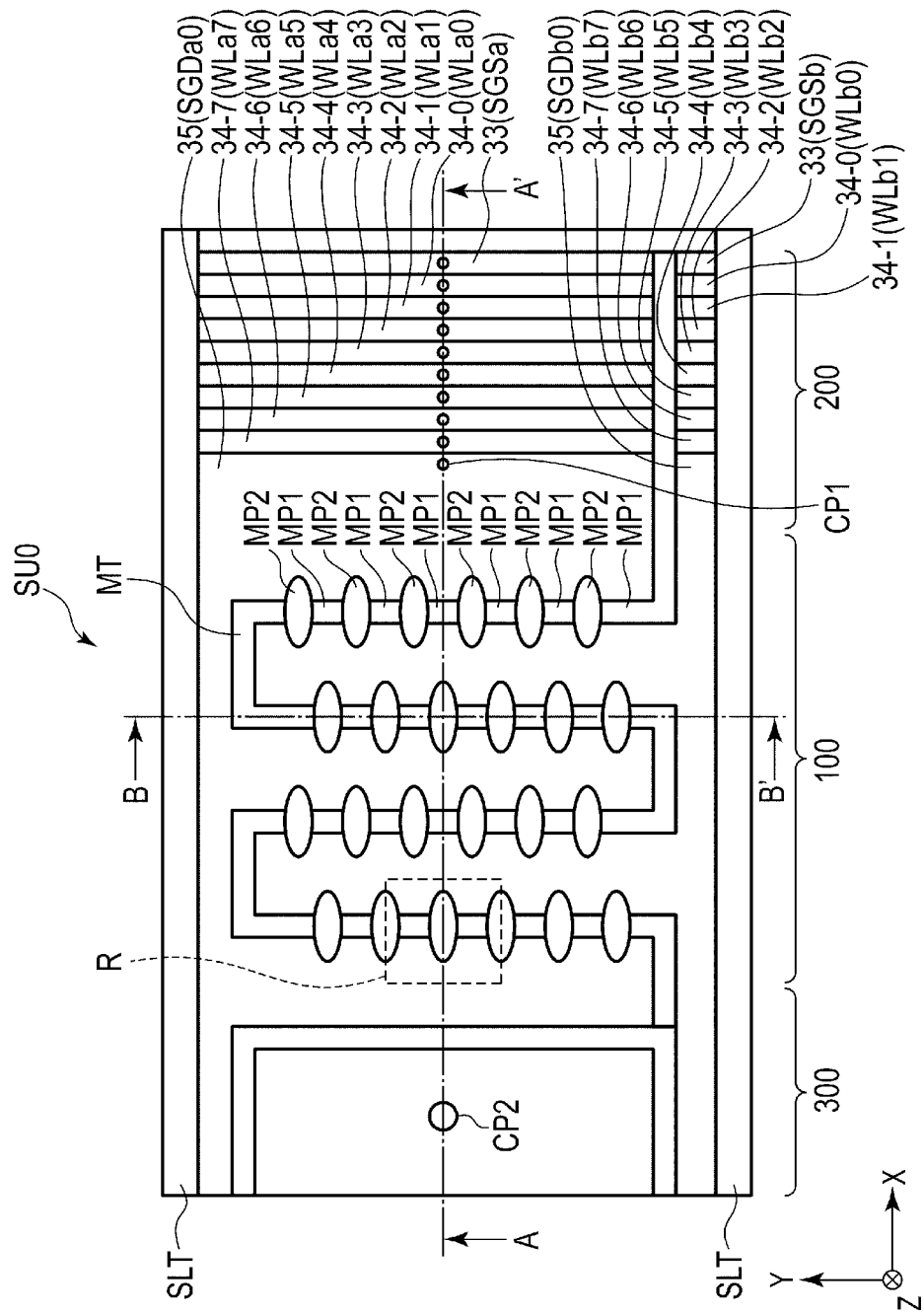
FIG. 3 is a plan view illustrating an example of the memory cell array according to the embodiment.

Next, the planar configuration of the memory cell array 11 will be described with reference to FIG. 3. FIG. 3 is a plan view illustrating an example of the memory cell array 11, and illustrates a part of the string unit SU0. In the following drawings including FIG. 3, two directions perpendicular to (or intersecting) each other and parallel to a surface of the semiconductor substrate are defined as an X-axis direction and a Y-axis direction, and a direction perpendicular to (or intersecting) the X-axis direction and the Y-axis direction (an XY plane) is defined as a Z-axis direction.

As illustrated in FIG. 3, the string unit SU0 includes a cell region 100, a hook-up region 200 (also referred to as draw-out region 200 in some contexts), and a contact region 300. Specifically, the hook-up region 200, the cell region 100, and the contact region 300 are sequentially provided from one end of the string unit SU0 to the other end thereof in the X-axis direction. in some examples, the hook-up region 200 may be provided at both ends of the string unit SU0. Similarly, a plurality of cell regions 100 and a plurality of contact regions 300 may be provided along the X-axis direction.

In the memory cell array 11, a conductive layer 33, conductive layers 34-0 to 34-7, and a conductive layer 35 are stacked in the Z-axis direction. The conductive layer 33 functions as a selection gate line SGS. The conductive layers 34-0 to 34-7 function as word lines WL0 to WL7, respectively. The conductive layer 35 functions as a selection gate line SGD.

The conductive layer 33, the conductive layers 34-0 to 34-7, and the conductive layer 35 are each divided by a memory trench MT. A plurality of memory pillars MP1 and MP2 are provided along the memory trench MT. Specifically, for example, the conductive layer 35 is split by the memory trench MT into two portions, and these two portions function as the selection gate line SGDa0 and the selection gate line SGDb0, respectively. Similarly, the conductive layers 34-0 to 34-7 are divided into two portions by the memory trench MT, and these portions functions as the word lines WLa and the word lines WLb, respectively. The conductive layer 33 is divided into two portions by the memory trench MT, and these portions function as the selection gate line SGSa and the selection gate line SGSb, respectively.

A conductive layer 35 portion corresponding to the selection gate line SGDa0 and a conductive layer 35 portion corresponding to the selection gate line SGDb0 are alternately arranged in the X-axis direction across the memory trench MT. The selection gate lines SGDa0 and SGDb0 in the cell region 100 each have a comb-like shape. Furthermore, comb-teeth portions of the selection gate line SGDa0 and comb-teeth portions of the selection gate line SGDb0 are arranged facing each other in the X-axis direction to be alternately meshed with each other. The conductive layers 33 and 34-0 to 34-7, that is, the selection gate lines SGS and the word lines WL0 to WL7, are similarly formed with the meshed comb-teeth portions facing across the memory trench MT. Accordingly, in the cell region 100, the memory trench MT has what may be described as a rectangular waveform shape extending along the X-axis direction.

In the cell region 100, the memory pillars MP1 and MP2 corresponding to the memory group MG are alternately provided along the path of the memory trench MT as described above. The length of the memory pillar MP2 in the X-axis direction is longer than the length of the memory pillar MP1 in the X-axis direction. The memory pillar MP1 is arranged in a portion of the memory trench MT having a shape approaching rectangular (in plan view), and the memory pillar MP2 is arranged in a portion of the memory trench MT having an elongated circle shape (minor axis in Y-direction; major axis in X-direction). This elongated circle shape may also be referred to as an oval shape, a curved shape, an egg shape, an oblong shape, or an elliptical shape. In the following, any memory cell provided in a memory pillar MP1 region will be referred to as a flat cell FC, and any memory cell provided in a memory pillar MP2 region will be referred to as a circular cell CC.

Here, as illustrated in FIG. 3, for example, six memory pillars MP1 and six memory pillars MP2 are alternatively arranged in the Y-axis direction between the portion of conductive layer 35 for the selection gate line SGDa0 and the portion of conductive layer 35 for the selection gate line SGDb0 adjacent thereto. Accordingly, twelve memory pillars MP1 and MP2 are arranged in four rows in a zigzag manner along the X-axis direction. Although the memory pillars MP1 and MP2 are depicted here as arranged according to the rectangular waveform shape of the memory trench MT here, the shape of the arrangement of the memory pillars MP1 and MP2 in the cell region 100 may be any shape.

In the hook-up region 200, the end portions of the conductive layers 33, 34-0 to 34-7, and 35 are drawn out stepwise in the X-axis direction. Hereinafter, a region drawn out stepwise in this manner will be referred to as a "drawn out region". FIG. 3 illustrates a case in which a drawn-out region corresponding to the selection gate line SGSa, the word lines WLa0 to WLa7, and the selection gate line SGDa0 is provided at one end of the string unit SU0, and a drawn-out region corresponding to the selection gate line SGSb, the word lines WLb0 to WLb7, and the selection gate line SGDb0 is provided at the other end thereof.

A contact plug CP1 is provided in each drawn-out region and the contact plug CP1 is connected to each drawn-out region. That is, the drawn-out region functions as a connection part to the contact plug CP1. The contact plug CP1 electrically connects the drawn-out region and an upper layer wiring provided above the memory cell array 11.

In the contact region 300, a plurality of contact plugs CP2 are provided in a region surrounded by the memory trench MT. The contact plugs CP2 pass through the memory cell array 11 and electrically connect the upper layer wiring provided on the memory cell array 11 and a circuit provided below the memory cell array 11, for example, the row decoder 12, or the sense amplifier 13, or the like.

The region surrounded by the memory trench MT is formed by an insulating layer such that the contact plug CP2, the word lines WL, and the selection gate lines SGD and SGS are not in contact with one another. The number of contact plugs CP2 arranged in the region surrounded by the memory trench MT is any number.

Two slits SLT extending in the X-axis direction are in contact with two side surfaces of the string unit SU0 extending in the X-axis direction, respectively. The slit SLT is filled with an insulating material, for example, silicon oxide. The side surfaces of the slit SLT are in contact with the side surfaces of the conductive layers 33, 34-0 to 34-7, and 35.

1. 4 Cross-Sectional Configuration of Memory Cell Array

Figure 4:
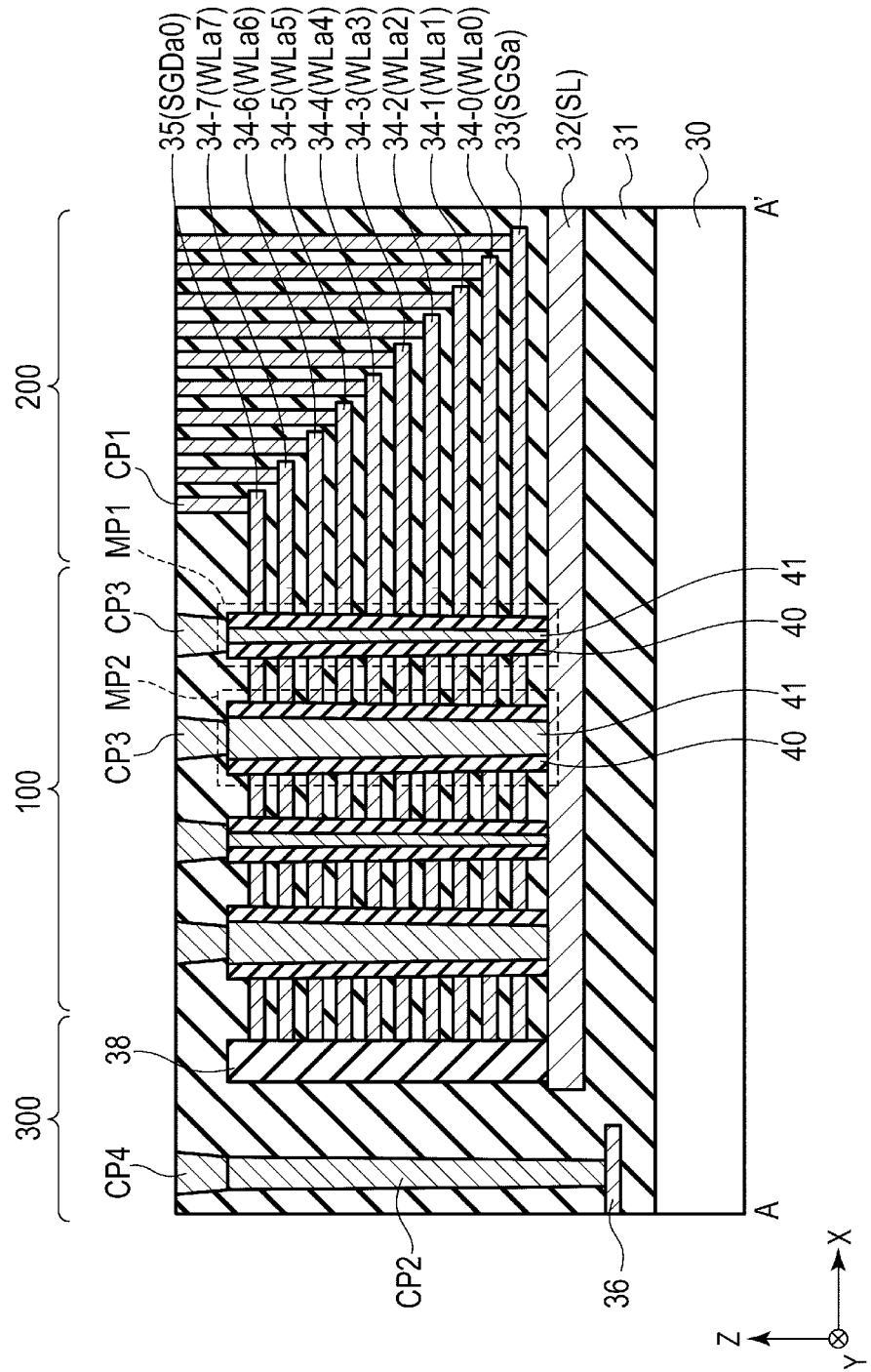
FIG. 4 is a cross-sectional view taken along line A-A' of FIG. 3.
Figure 5:
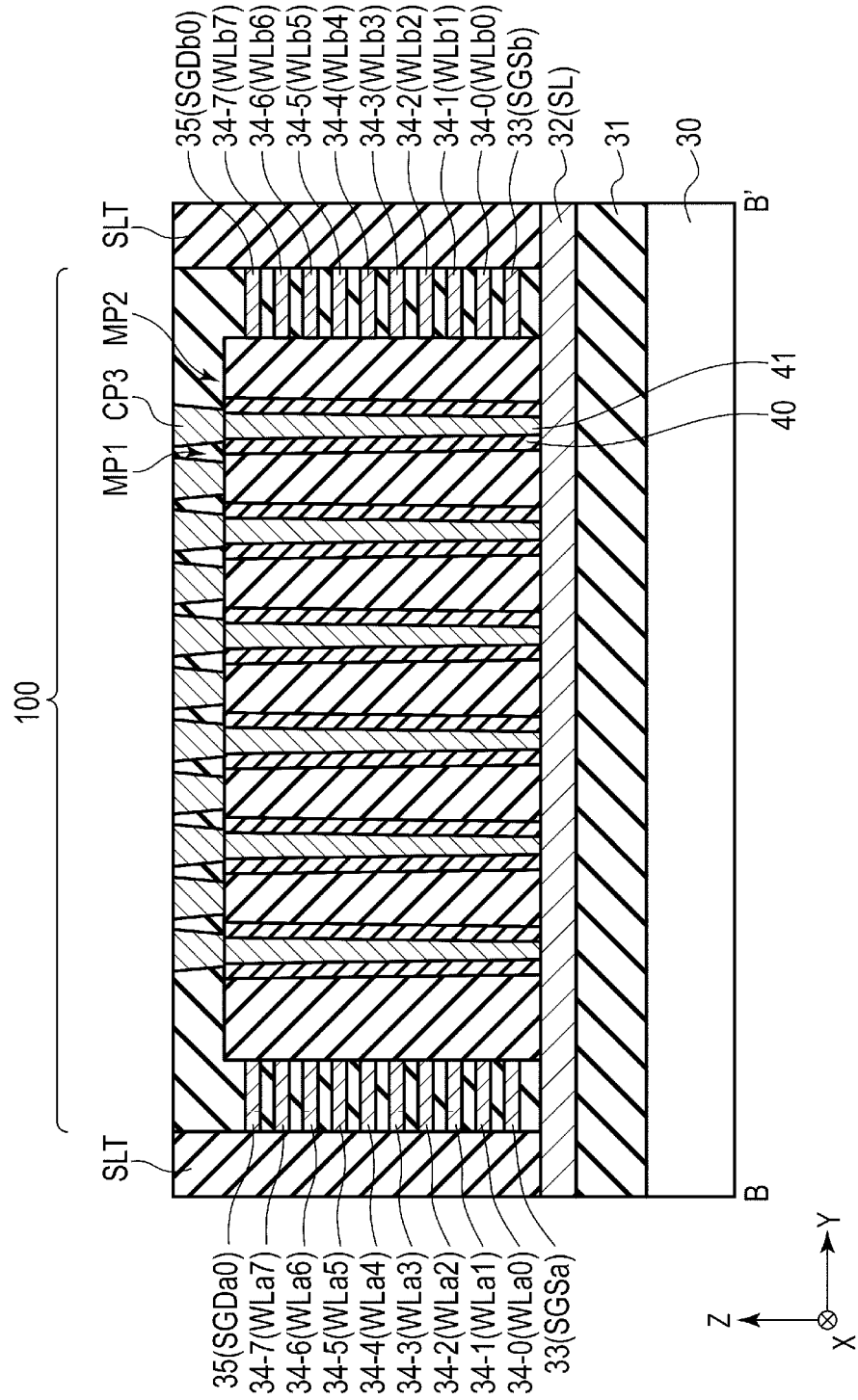
FIG. 5 is a cross-sectional view taken along line B-B' of FIG. 3.

Next, a cross-sectional configuration of the memory cell array 11 will be described. FIG. 4 is a cross-sectional view taken along line A-A' of FIG. 3. FIG. 5 is a cross-sectional view taken along line B-B' of FIG. 3. For simplicity of description, the bit lines BL are omitted in FIGS. 4 and 5.

As illustrated in FIG. 4, an insulating layer 31 is provided on a semiconductor substrate 30. The semiconductor substrate 30 comprises, for example, a silicon semiconductor substrate. The insulating layer 31 comprises, for example, a silicon oxide layer.

The memory cell array 11 is provided on the insulating layer 31. Specifically, a conductive layer 32 is provided on the insulating layer 31 both in the cell region 100 and the hook-up region 200. The conductive layer 32 functions as a source line SL. The conductive layer 32 includes, for example, a metal material such as tungsten (W) or titanium nitride (TiN), or a semiconductor such as polycrystalline silicon or single crystal silicon.

A stacked body in which the insulating layer 31, the conductive layer (SGS) 33, the word line conductive layers 34-0 to 34-7 (WL0 to WL7), and the conductive layer (SGD) 35 are alternately stacked is provided on the conductive layer 32. That is, the conductive layers 33, 34-0 to 34-7 and 35 are arranged with the insulating layer 31 interposed between each of the layers in the Z-axis direction. The conductive layers 33, 34-0 to 34-7, and 35 include, for example, a metal material such as W or TiN, or a semiconductor such as polycrystalline silicon or single crystal silicon. A case in which W and TiN are used for the conductive layers 33, 34-0 to 34-7, and 35 will be described in the present embodiment below. TiN functions as a barrier layer or an adhesion layer when forming a W layer.

In the cross-sectional view of FIG. 4, in the cell region 100, the memory pillars MP1 and MP2 are alternately provided in the X-axis direction. The memory pillars MP1 and MP2 extend passing through the conductive layers 33, 34-0 to 34-7, and 35, and the bottom surfaces thereof contact with the conductive layer 32. Each of the memory pillars MP1 and MP2 includes a cell insulating film 40 and a semiconductor layer 41. A core insulating film is provided in the semiconductor layer 41, but is omitted here.

A contact plug CP3 electrically connected to the semiconductor layer 41 is provided on each of the memory pillars MP1 and MP2. Although not specifically illustrated in FIG. 4, a bit line BL extending in the Y-axis direction is provided on the contact plug CP3. That is, each of the memory pillars MP1 and MP2 is electrically connected to a bit line BL via the contact plug CP3. The contact plug CP3 contains a conductive material, for example, tungsten (W) or titanium (Ti). For example, titanium is used to form a silicide layer at an interface with the semiconductor layer 41 and to reduce a resistance at the interface with the semiconductor layer 41.

In the contact region 300, the contact plug CP2 is provided in the insulating layer 31. A bottom surface of the contact plug CP2 is in contact with the conductive layer 36 arranged below the conductive layer 32, and a side surface of the contact plug CP2 is in contact with the insulating layer 31. The conductive layer 36 is connected to a circuit, for example, the row decoder 12, the sense amplifier 13, or the like. The position of the bottom surface of the contact plug CP2 is lower than the bottom surface of the conductive layer 32, and the position of the upper surface the contact plug CP2 is higher than the upper surface of the conductive layer 35. The contact plug CP2 includes, for example, a metal material such as W, Ti, or TiN. A contact plug CP4 for connection to an upper layer wiring is provided on the contact plug CP2. The contact plug CP4 includes, for example, a metal material such as W, Ti or TiN. An insulating layer 38 is provided between the contact region 300 and the cell region 100.

In the hook-up region 200, a region in which the conductive layers 33, 34-0 to 34-7, and 35 are drawn out stepwise in the X-axis direction is provided. The contact plug CP1 is provided in each drawn-out region. For example, an upper end of the contact plug CP1 is connected to the row decoder 12 provided below the memory cell array 11 via the upper layer wiring provided above the memory cell array 11 and the contact plugs (e.g., contact plug CP2 and the like). The contact plug CP1 includes, for example, a metal material such as W, Ti, or TiN.

The cross-sectional structure of the memory cell array 11 will be described with reference to FIG. 5. In the cell region 100, the memory pillars MP1 and MP2 are alternately provided along the memory trench MT extending in the Y-axis direction. In the example illustrated in FIG. 5, the conductive layers 33, 34-0 to 34-7 and 35 (hereinafter referred to as a a-side conductive layer 37a) provided on a B side of the cross section with respect to the memory trench MT function as the selection gate line SGSa, the word lines WLa0 to WLa7, and the selection gate line SGDa0, respectively. On the other hand, the conductive layers 33, 34-0 to 34-7 and 35 (hereinafter referred to together as a b-side conductive layer 37b) provided on a B' side of the cross section with respect to the memory trench MT function as the selection gate line SGSb, the word Lines WLb0 to WLb7, and the selection gate line SGDb0, respectively.

The slits SLT extending in the X-axis direction are provided on both side surfaces of the string unit SU in the Y-axis direction. The bottom surface of the slit SLT is reached to the upper surface of the conductive layer 32. The side surface of the slit SLT is in contact with the side surfaces of the conductive layers 33, 34-0 to 34-7, and 35, respectively. The slit SLT includes an insulating layer containing an insulating material, for example, silicon oxide.

1. 5 Configuration of Memory Pillar

Next, the configurations of the memory pillars MP1 and MP2 of the semiconductor memory device according to the embodiment will be described.

Figure 6:
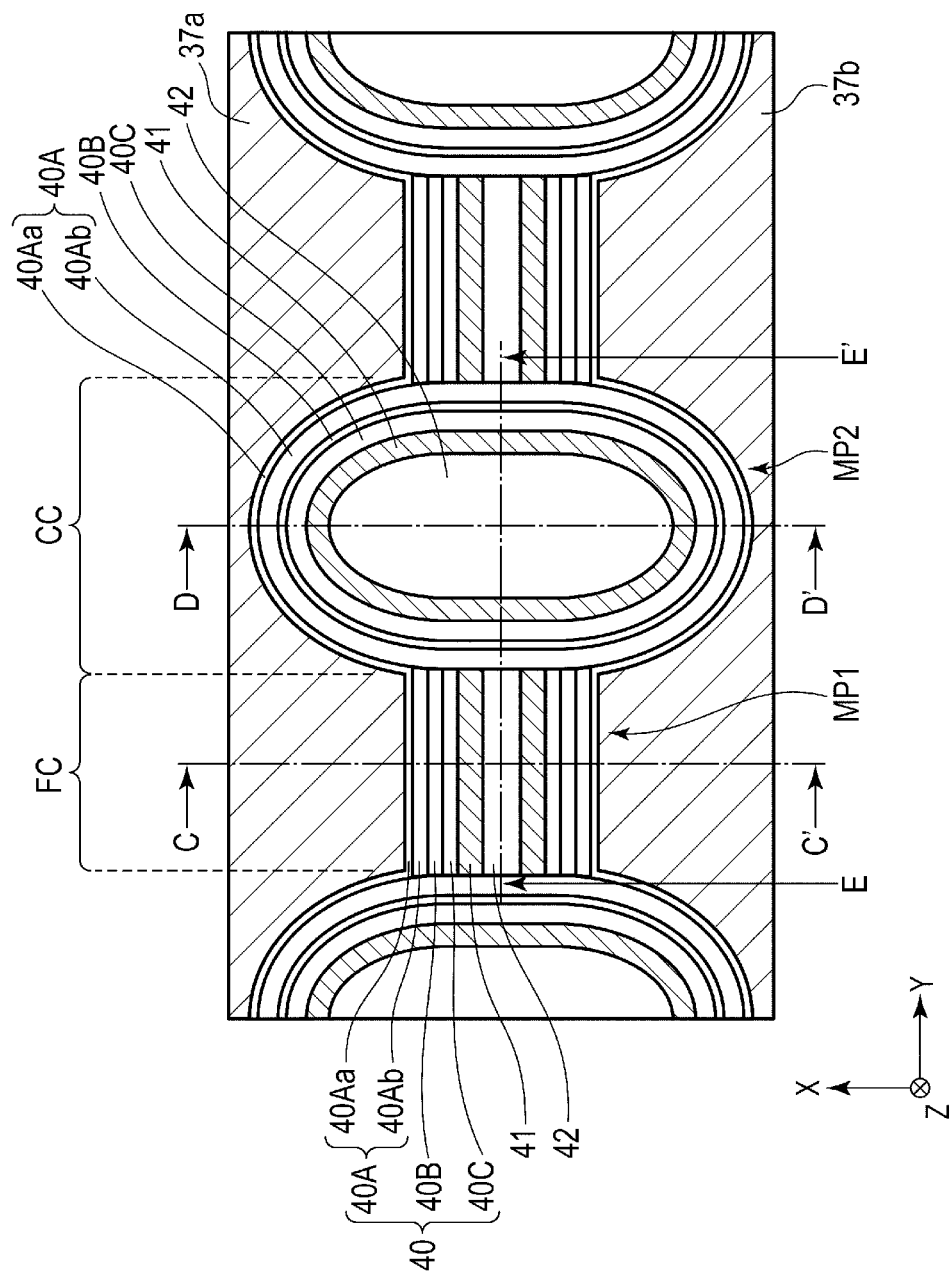
FIG. 6 is a diagram illustrating a planar configuration of a memory pillar of the embodiment.

Hereinafter, the planar configurations of the memory pillars MP1 and MP2 will be described with reference to FIG. 6. FIG. 6 is an enlarged plan view of a region R of FIG. 3, and illustrates the planar configurations of the memory pillars MP1 and MP2.

As illustrated in FIG. 6, end portions of the a-side conductive layer 37a of the conductive layers 33, 34-0 to 34-7, and 35 include a linear portion formed linearly in the Y-axis direction and a curved portion formed in an elongated circular shape. The linear portion and the curved portion are alternately arranged. Likewise, end portions of the b-side conductive layer 37b of the conductive layers 33, 34-0 to 34-7, and 35 include a linear portion formed linearly in the Y-axis direction and a curved portion formed in an elongated circular shape, and the linear portion and the curved portion are alternately arranged. The linear portion of the a-side conductive layer 37a and the linear portion of the b-side conductive layer 37b are arranged to face each other, and the curved portion of the a-side conductive layer 37a and the curved portion of the b-side conductive layer 37b are arranged to face each other.

A memory pillar MP1 (or the flat cell FC) is provided between the linear portion of the a-side conductive layer 37a and the linear portion of the b-side conductive layer 37b which face each other. The memory pillar MP1 includes, for example, a cell insulating film 40, a semiconductor layer 41, and a core insulating film 42 which are sequentially provided from both sides of the a-side conductive layer 37a and the b-side conductive layer 37b. The cell insulating film 40 includes a block insulating film 40A, a charge storage film (also referred to as a charge storage layer) 40B, and a tunnel insulating film (or a tunnel oxide film) 40C. The block insulating film 40A includes, for example, an aluminum oxide film 40Aa and a silicon oxide film 40Ab sequentially arranged from the both sides of the a-side conductive layer 37a and the b-side conductive layer 37b. The core insulating film 42 is omitted except in the detailed drawing.

The memory pillar MP2 (or the circular cell CC) is provided between the curved portion of the a-side conductive layer 37a and the curved portion of the b-side conductive layer 37b which face each other. Similar to the memory pillar MP1, the memory pillar MP2 includes, for example, a cell insulating film 40, a semiconductor layer 41, and a core insulating film 42 sequentially arranged from the both sides of the a-side conductive layer 37a and the b-side conductive layer 37b. The cell insulating film 40 includes a block insulating film 40A, a charge storage film 40B, and a tunnel insulating film 40C. The block insulating film 40A includes, for example, an aluminum oxide film 40Aa and a silicon oxide film 40Ab arranged from the both sides of the a-side conductive layer 37a and the b-side conductive layer 37b.

Figure 7:
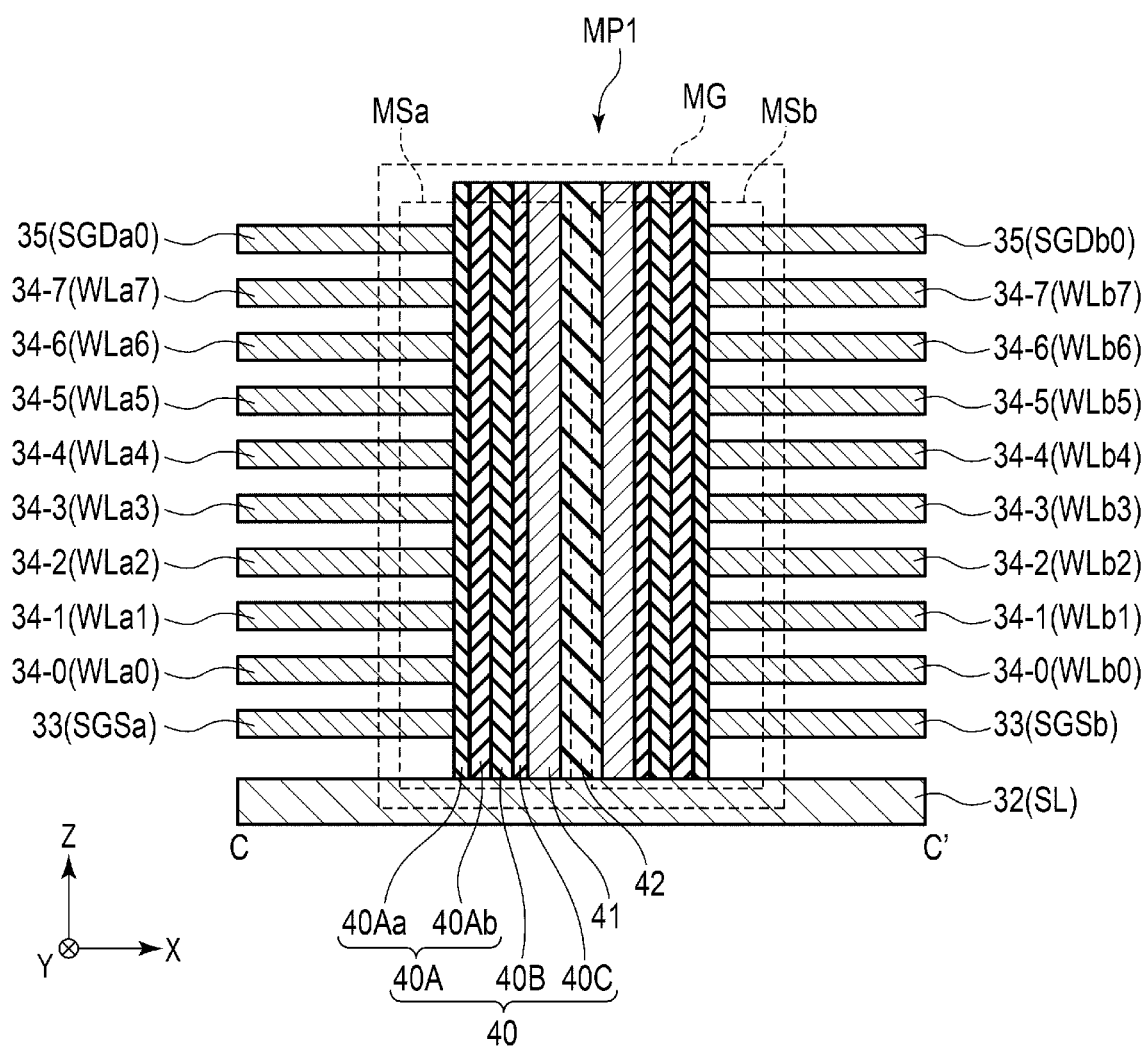
FIG. 7 is a cross-sectional view taken along line C-C' of the memory pillar of FIG. 6.
Figure 8:
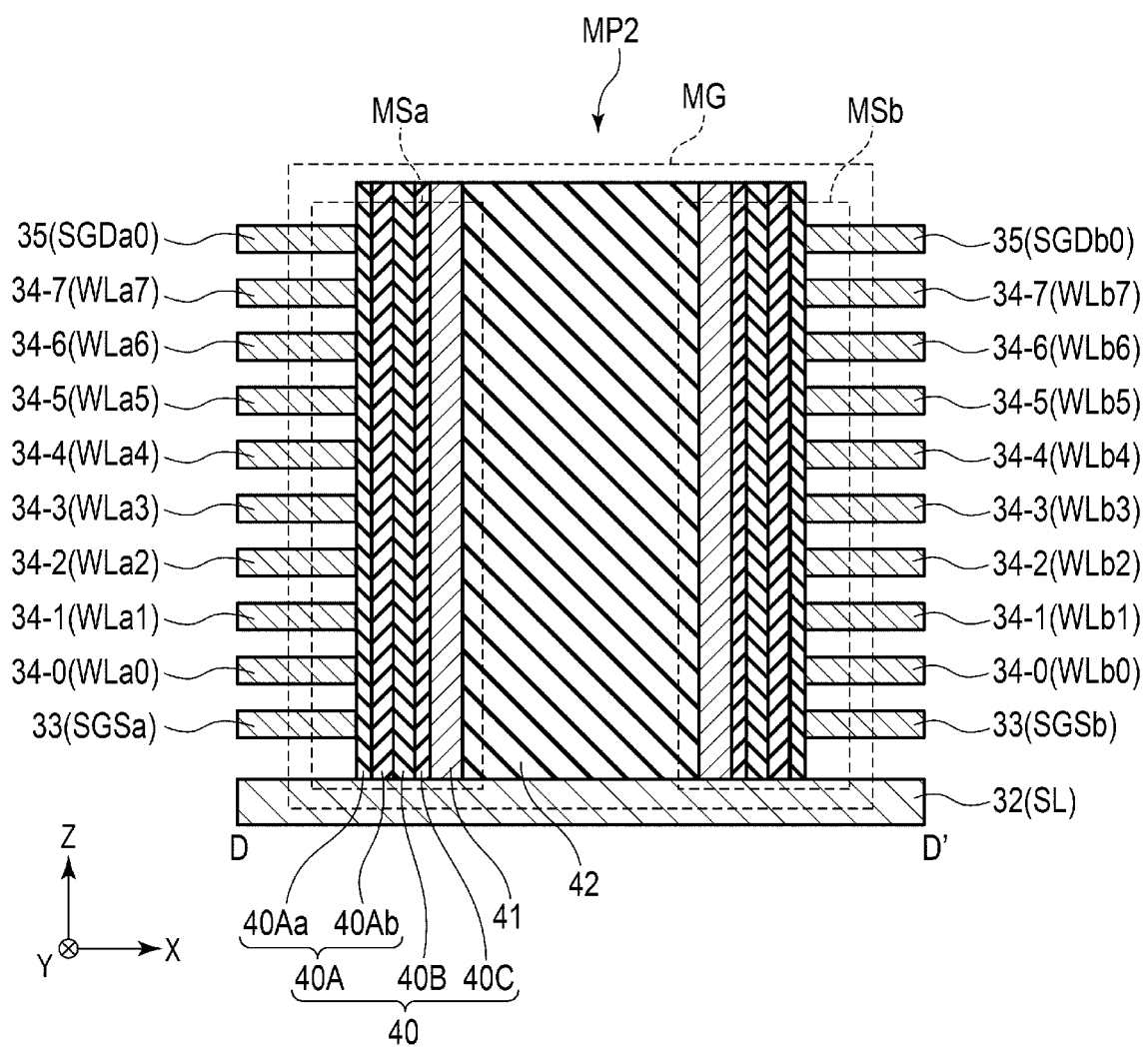
FIG. 8 is a cross-sectional view taken along line D-D' of the memory pillar of FIG. 6.
Figure 9:
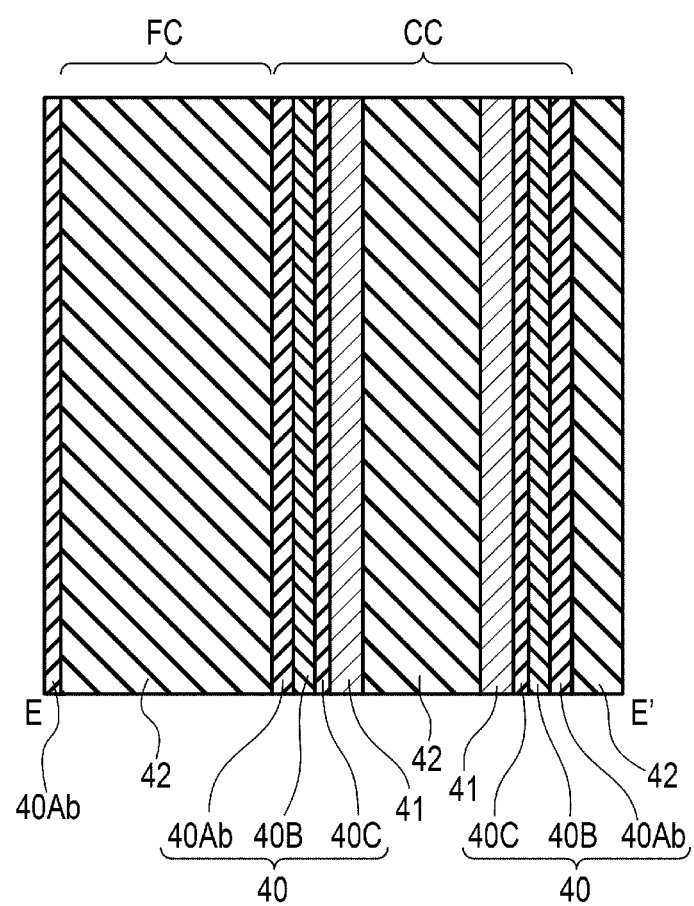
FIG. 9 is a cross-sectional view taken along line E-E' of the memory pillar of FIG. 6.

Next, the cross-sectional configurations of the memory pillars MP1 and MP2 will be described with reference to FIGS. 7 to 9. FIG. 7 is a cross-sectional view taken along line C-C' of the memory pillar MP1 of FIG. 6. FIG. 8 is a cross-sectional view taken along line D-D' of the memory pillar MP2 of FIG. 6. FIG. 9 is a cross-sectional view taken along line E-E' of the memory pillars MP1 and MP2 of FIG. 6. Here, the insulating layer 31 is omitted.

The cross-sectional configuration of the memory pillar MP1 will be described below.

As illustrated in FIG. 7, the conductive layer 33 (selection gate lines SGSa and SGSb), the conductive layers 34-0 to 34-7 (word lines WLa0 to WLa7 and WLb0 to WLb7), and the conductive layer 35 (selection gate lines SGDa0 and SGDb0) are stacked on the conductive layer 32 and spaced apart from each other. The memory pillar MP1 is provided passing through the conductive layers 33, 34-0 to 34-7, and 35. The conductive layer 33 as the selection gate line SGSa and the conductive layer 33 as the selection gate line SGSb are divided by the memory pillar MP1. Similarly, the conductive layers 34-0 to 34-7 as the word lines WLa0 to WLa7 and the conductive layers 34-0 to 34-7 as the word lines WLb0 to WLb7 are divided by the memory pillar MP1. The conductive layer 35 as the selection gate line SGDa0 and the conductive layer 35 as the selection gate line SGDb0 are divided by the memory pillar MP1.

The memory string MSa is formed at intersections of the conductive layer 33 (selection gate line SGSa), the conductive layers 34-0 to 34-7 (word lines WLa0 to WLa7), the conductive layer 35 (selection gate line SGDa0), and the memory pillar MP1. The memory string MSb is formed at intersections of the conductive layer 33 (selection gate line SGSb), the conductive layers 34-0 to 34-7 (word lines WLb0 to WLb7), and the conductive layer 35 (selection gate line SGDb0), and the memory pillar MP1.

As described above, the memory pillar MP1 includes, for example, the cell insulating film 40, the semiconductor layer 41, and the core insulating layer 42. The cell insulating film 40 includes the block insulating film 40A, the charge storage film 40B, and the tunnel insulating film 40C. The block insulating film 40A includes, for example, the aluminum oxide film 40Aa and the silicon oxide film 40Ab. Specifically, the aluminum oxide film 40Aa and the silicon oxide film 40Ab as the block insulating film 40A are sequentially provided on the inner walls of the a-side conductive layer 37a and the b-side conductive layer 37b. The charge storage film 40B is provided on the inner wall of the silicon oxide film 40Ab. The tunnel insulating film 40C is provided on the inner wall of the charge storage film 40B. The semiconductor layer 41 is provided on the inner wall of the tunnel insulating film 40C. Furthermore, the core insulating layer 42 is provided in the semiconductor layer 41.

A portion in which the memory pillar MP1 and the conductive layer 33 as the selection gate line SGSa intersect each other functions as the selection transistor STa2. Portions in which the memory pillar MP1 and the conductive layers 34-0 to 34-7 as the word lines WLa0 to WLa7 intersect each other function as the memory cell transistors MCa0 to MCa7. A portion in which the memory pillar MP1 and the conductive layer 35 as the selection gate line SGDa0 intersect each other functions as the selection transistor STa1.

Similarly, a portion of the memory pillar MP1 and the conductive layer 33 as the selection gate line SGSb intersect each other functions as the selection transistor STb2. Portions in which the memory pillar MP1 and the conductive layers 34-0 to 34-7 serving as the word lines WLb0 to WLb7 intersect each other function as the memory cell transistors MCb0 to MCb7. A portion in which the memory pillar MP1 and the conductive layer 35 as the selection gate line SGDb0 intersect each other functions as the selection transistor STb1.

The semiconductor layer 41 functions as a channel layer of the memory cell transistors MCa and MCb and the selection transistors STa1, STa2, STb1, and STb2. The semiconductor layer 41 includes, for example, a polycrystalline silicon layer.

The charge storage film 40B functions as a charge storage film in the memory cell transistors MCa and MCb to accumulate charges injected from the semiconductor layer 41. The charge storage film 40B includes, for example, a silicon nitride film.

The tunnel insulating film 40C functions as a potential barrier when charges are injected from the semiconductor layer 41 into the charge storage film 40B or when charges accumulated in the charge storage film 40B are discharged to the semiconductor layer 41. The tunnel insulating film 40C includes, for example, a silicon oxide film.

The block insulating film 40A prevents charges accumulated in the charge storage film 40B from diffusing to the conductive layers 34-0 to 34-7 (word lines WL). As described above, the block insulating film 40A includes, for example, the aluminum oxide film 40Aa and the silicon oxide film 40Ab.

Next, the cross-sectional configuration of the memory pillar MP2 will be described below.

As illustrated in FIG. 8, the conductive layer 33 (selection gate lines SGSa and SGSb), the conductive layers 34-0 to 34-7 (word lines WLa0 to WLa7 and WLb0 to WLb7), and the conductive layer 35 (selection gate lines SGDa0 and SGDb0) are stacked on the conductive layer 32 spaced apart from each other. The memory pillar MP2 is provided passing through the conductive layers 33, 34-0 to 34-7, and 35. The conductive layer 33 as the selection gate line SGSa and the conductive layer 33 as the selection gate line SGSb are divided by the memory pillar MP2. Similarly, the conductive layers 34-0 to 34-7 as the word lines WLa0 to WLa7 and the conductive layers 34-0 to 34-7 as the word lines WLb0 to WLb7 are divided by the memory pillar MP2. The conductive layer 35 as the selection gate line SGDa0 and the conductive layer 35 as the selection gate line SGDb0 are divided by the memory pillar MP2.

The memory string MSa is formed at an intersection of the conductive layer 33 (selection gate line SGSa), the conductive layers 34-0 to 34-7 (word lines WLa0 to WLa7), the conductive layer 35 (selection gate line SGDa0), and the memory pillar MP2. The memory string MSb is formed at an intersection of the conductive layer 33 (selection gate line SGSb), the conductive layers 34-0 to 34-7 (word lines WLb0 to WLb7), the conductive layer 35 (selection gate line SGDb0), and the memory pillar MP2.

Similar to the memory pillar MP1, the memory pillar MP2 includes the cell insulating film 40, the semiconductor layer 41, and the core insulating layer 42. The cell insulating film 40 includes the block insulating film 40A, the charge storage film 40B, and the tunnel insulating film 40C. The block insulating film 40A includes, for example, the aluminum oxide film 40Aa and the silicon oxide film 40Ab.

A portion in which the memory pillar MP2 and the conductive layer 33 as the selection gate line SGSa intersect each other functions as the selection transistor STa2. Portions in which the memory pillars MP2 and the conductive layers 34-0 to 34-7 as the word lines WLa0 to WLa7 intersect each other function as the memory cell transistors MCa0 to MCa7, respectively. A portion in which the memory pillar MP2 and the conductive layer 35 as the selection gate line SGDa0 intersect each other functions as the selection transistor STa1.

Similarly, a portion in which the memory pillar MP2 and the conductive layer 33 as the selection gate line SGSb intersect each other functions as the selection transistor STb2. Portions in which the memory pillar MP2 and the conductive layers 34-0 to 34-7 as the word lines WLb0 to WLb7 intersect each other function as the memory cell transistors MCb0 to MCb7. A portion in which the memory pillar MP2 and the conductive layer 35 as the selection gate line SGDb0 intersect each other functions as the selection transistor STb1.

As illustrated in FIG. 6, the memory cell transistors MCa and MCb (flat cells FC) provided on the memory pillar MP1 have a rectangular shape on a cross section of the XY plane. The memory cell transistors MCa and MCb (circular cells CC) provided on the memory pillar MP2 have a curved shape or an oval shape on the cross section of the XY plane.

As illustrated in FIGS. 6 and 9, the flat cell FC is in contact with the circular cell CC in the Y-axis direction. Specifically, the silicon oxide film 40Ab, the charge storage film 40B, the tunnel insulating film 40C, the semiconductor layer 41, and the core insulating layer 42 of the flat cell FC are in contact with the silicon oxide film 40Ab as the block insulating film 40A of the circular cell CC. Furthermore, the aluminum oxide film 40Aa of the flat cell FC is in contact with the aluminum oxide film 40Aa of the circular cell CC. An end region of the flat cell FC adjacent to a portion in which the flat cell FC and the circular cell CC contact to each other will be hereinafter referred to as a fringe region.

2. Method of Manufacturing Semiconductor Memory Device

Next, a method of manufacturing the semiconductor memory device according to the embodiment will be described. FIGS. 10A to 18A are plan views of structures formed in each of processes of manufacturing the semiconductor memory device according to the embodiment. FIGS. 10B to 18B are cross-sectional views taken along line A-A' of the structures formed in each of the processes of manufacturing the semiconductor memory device. FIGS. 10C to 18C are cross-sectional views taken along line B-B' of the structures formed in each of the processes of manufacturing the semiconductor memory device.

Figure 10A:
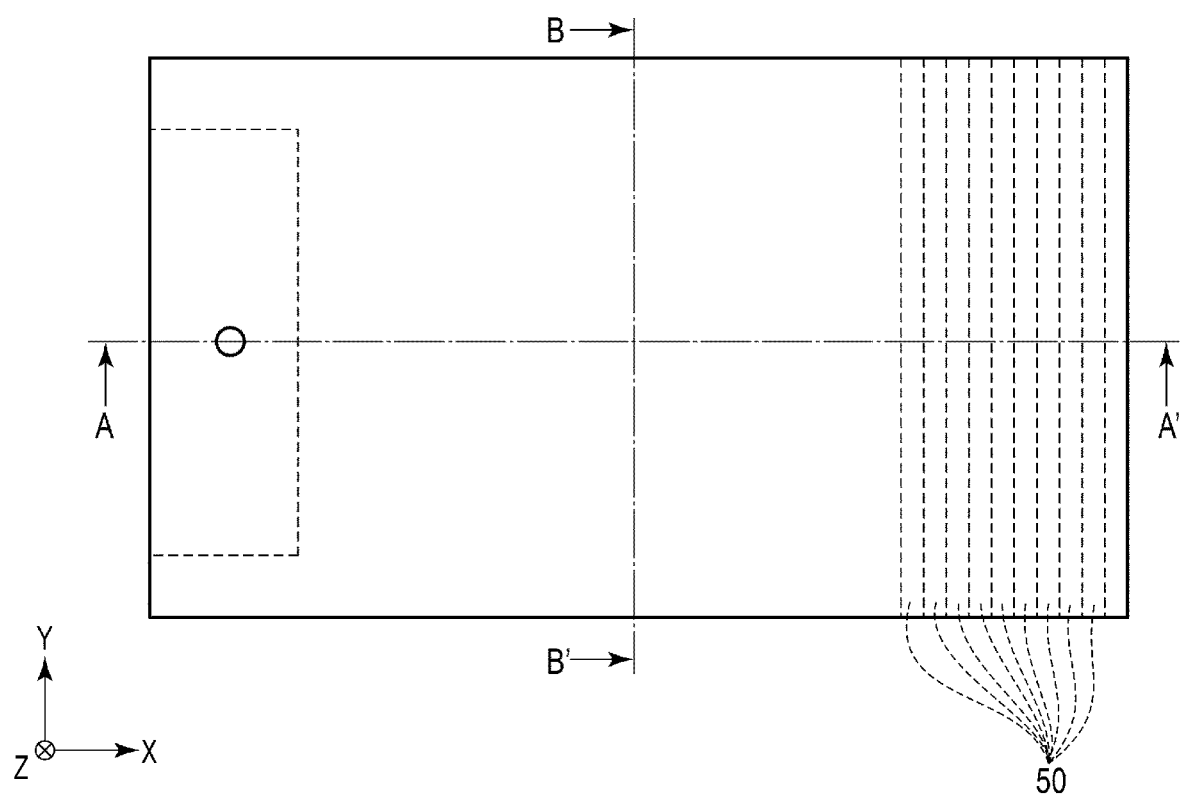
FIG. 10A is a plan view of a structure formed in manufacturing a semiconductor memory device according to an embodiment.
Figure 10B:
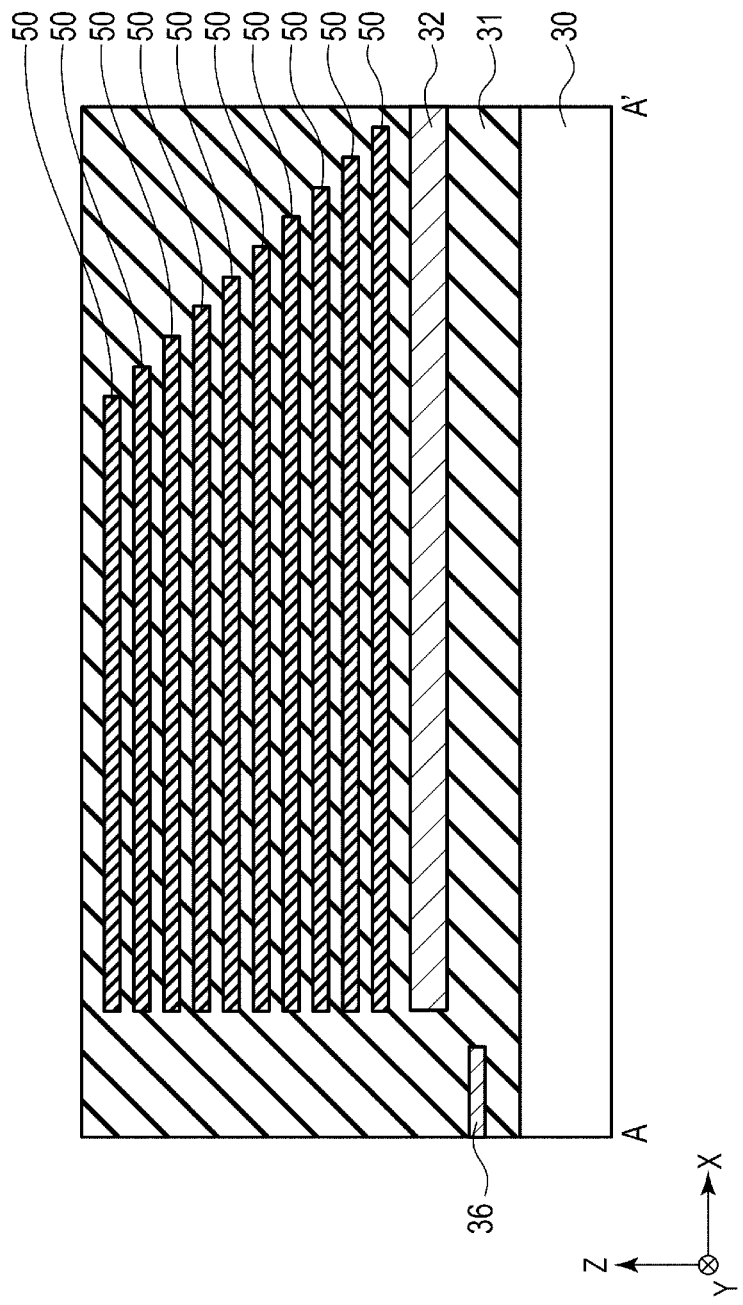
FIG. 10B is a cross-sectional view taken along line A-A' in FIG. 10A of a structure formed in manufacturing a semiconductor memory device according to an embodiment.

First, as illustrated in FIGS. 10A to 10C, an insulating layer 31, a conductive layer 32, and a stacked body including a plurality of insulating layers 31 and a plurality of insulating layers 50 are formed on a semiconductor substrate 30, and then a region drawn out stepwise is formed in the insulating layers 50. Specifically, as illustrated in FIGS. 10B and 10C, the insulating layer 31 is formed on the semiconductor substrate 30 by, for example, chemical vapor deposition (CVD) or atomic layer deposition (ALD). A conductive layer 36 is formed in the insulating layer 31. Furthermore, the conductive layer 32 is formed on the insulating layer 31. Next, the stacked body in which the plurality of insulating layers 31 and the plurality of insulating layers 50 are alternately stacked is formed on the conductive layer 32 by, for example, CVD or ALD. Next, drawn-out region in which the insulating layers 50 are sequentially drawn out stepwise in the X-axis direction is formed by a photolithography method. The insulating layer 50 includes, for example, a silicon nitride layer. The stacked body formed on the conductive layer 36 in the contact region 300 may be removed and an insulating layer such as a silicon oxide layer may be formed in the place of the removed stacked body.

Figure 11A:
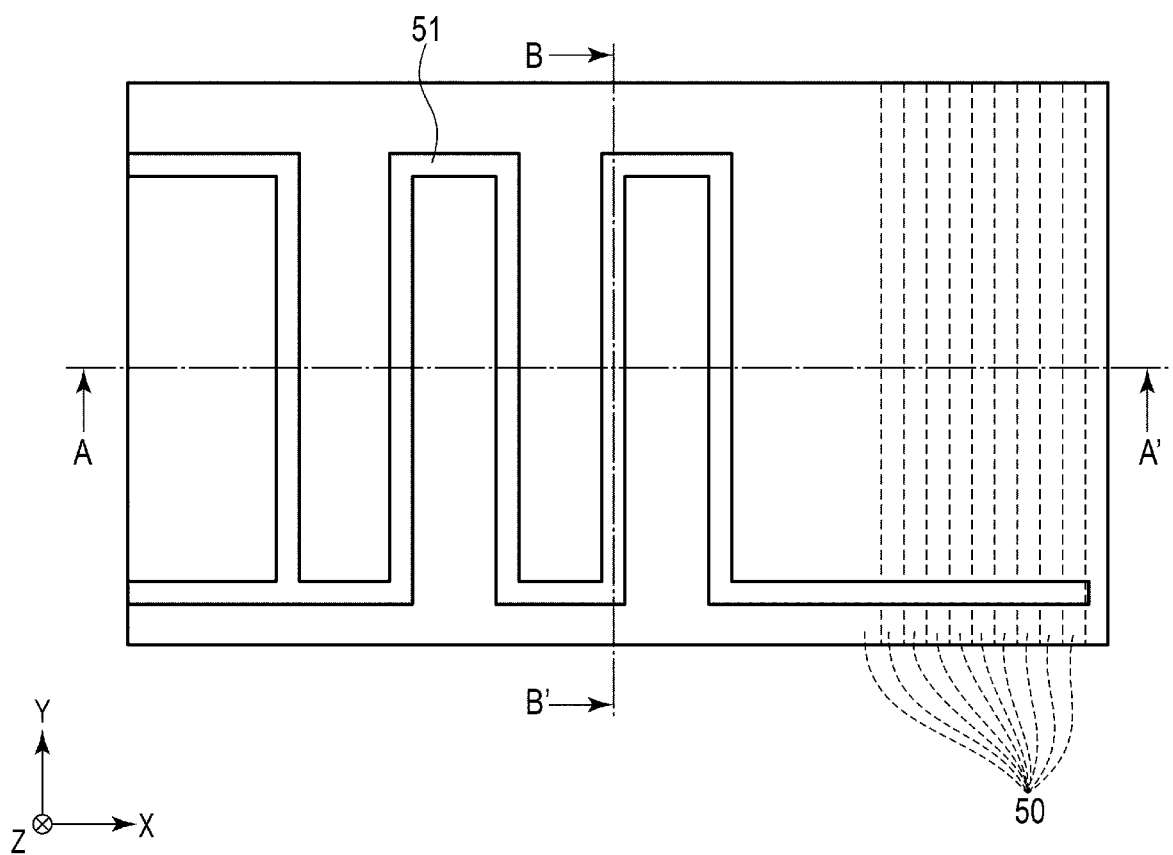
FIG. 11A is a plan view of a structure formed in manufacturing a semiconductor memory device according to an embodiment.
Figure 11B:
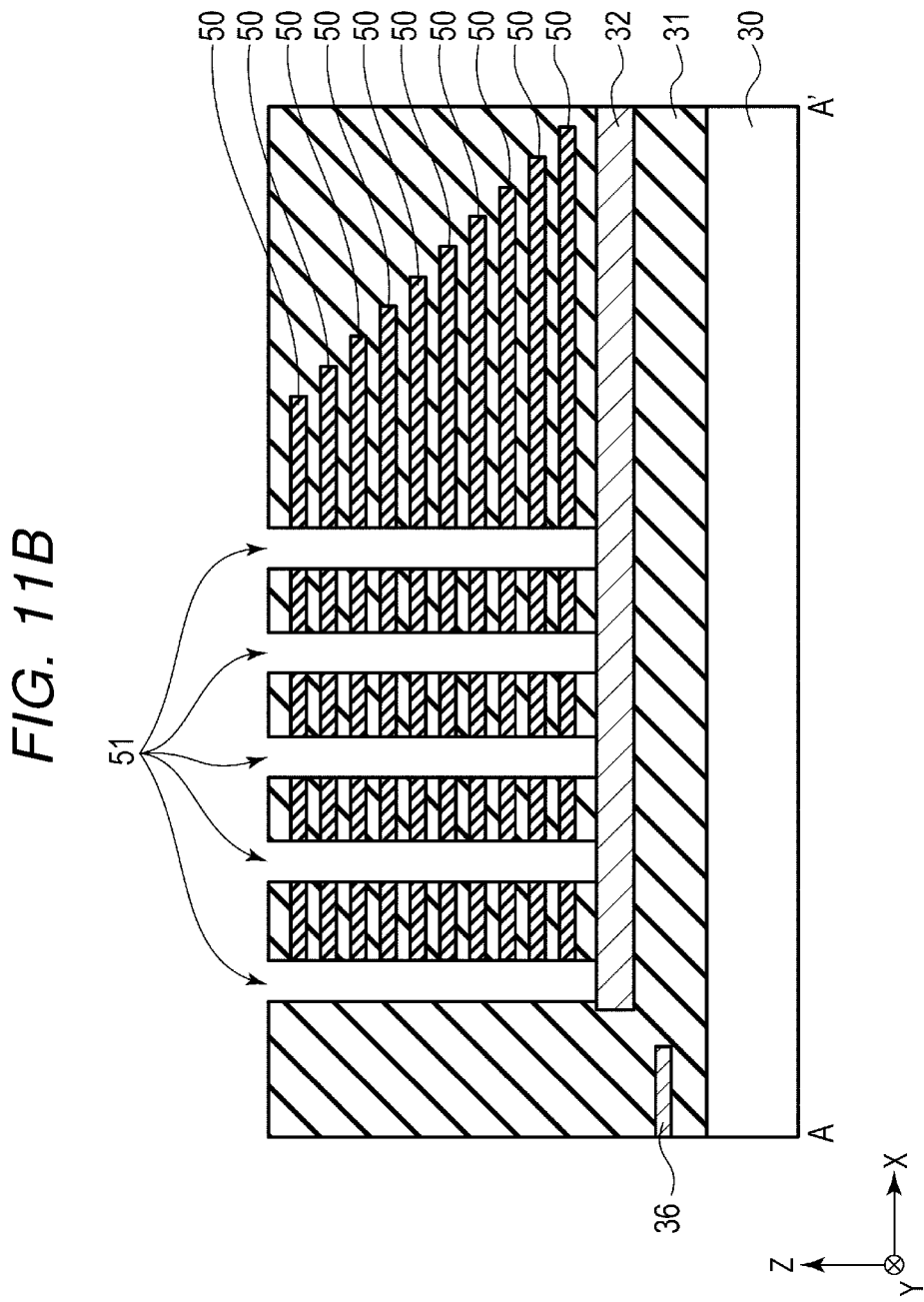
FIG. 11B is a cross-sectional view taken along line A-A' in FIG. 11A of a structure formed in manufacturing a semiconductor memory device according to an embodiment.

Next, as illustrated in FIGS. 11A to 11C, a trench 51 is formed to divide the insulating layers 50 in the stacked body. Specifically, as illustrated in FIGS. 11A to 11C, the trench 51 is formed by, for example, reactive ion etching (RIE) to divide the insulating layers 50 in the stacked body.

Figure 12A:
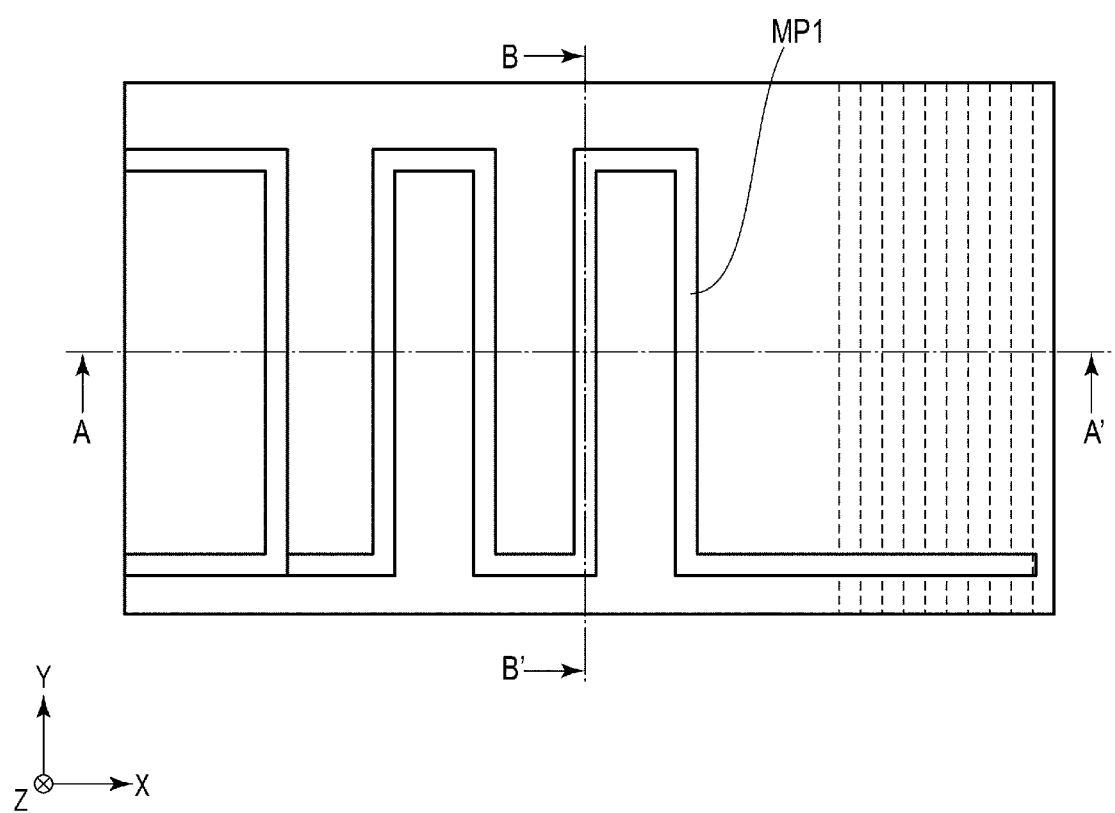
FIG. 12A is a plan view of a structure formed in manufacturing a semiconductor memory device according to an embodiment.
Figure 12B:
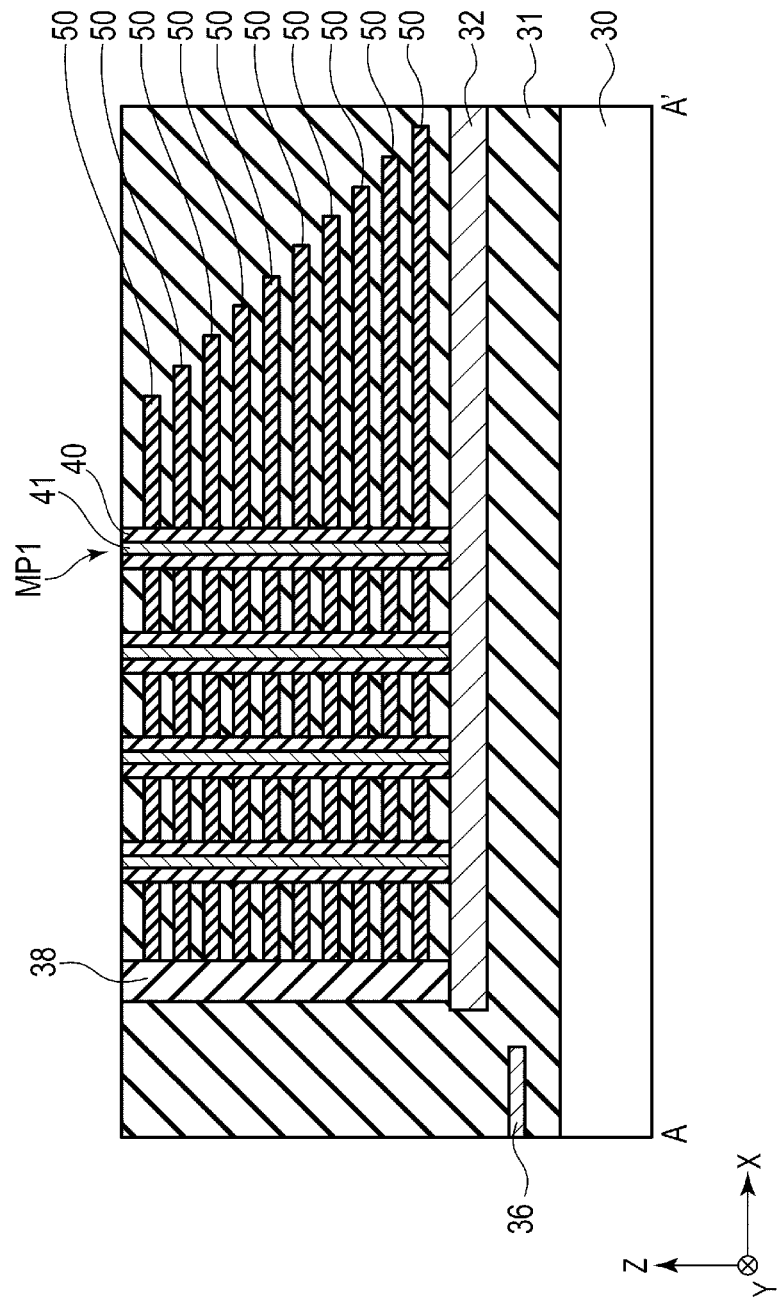
FIG. 12B is a cross-sectional view taken along line A-A' in FIG. 12A of a structure formed in manufacturing a semiconductor memory device according to an embodiment.
Figure 12C:
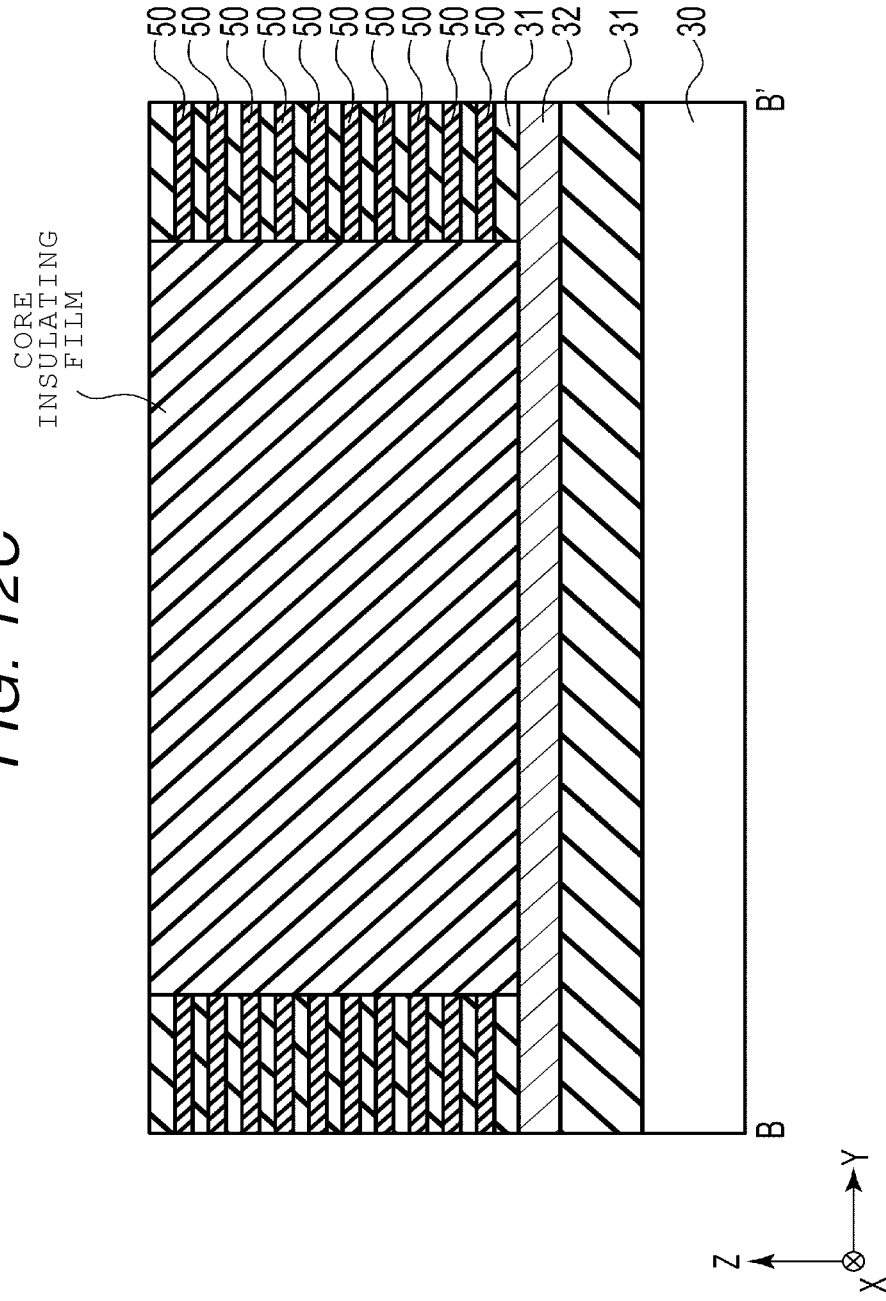
FIG. 12C is a cross-sectional view taken along line B-B' in FIG. 12 A of the structure formed in manufacturing a semiconductor memory device according to an embodiment.

Next, as illustrated in FIGS. 12A to 12C, a memory pillar MP1 is formed in the trench 51 to divide the insulating layers 50. Specifically, a cell insulating film 40 and a semiconductor layer 41 are sequentially formed on a side wall of the trench 51 to form the memory pillar MP1. A method of forming the memory pillar MP1 will be described in detail later. As illustrated in FIG. 12B, in the trench 51 between the contact region 300 and the cell region 100, an insulating layer 38 may be formed or the same layer as the memory pillar MP1 may be formed.

Figure 13A:
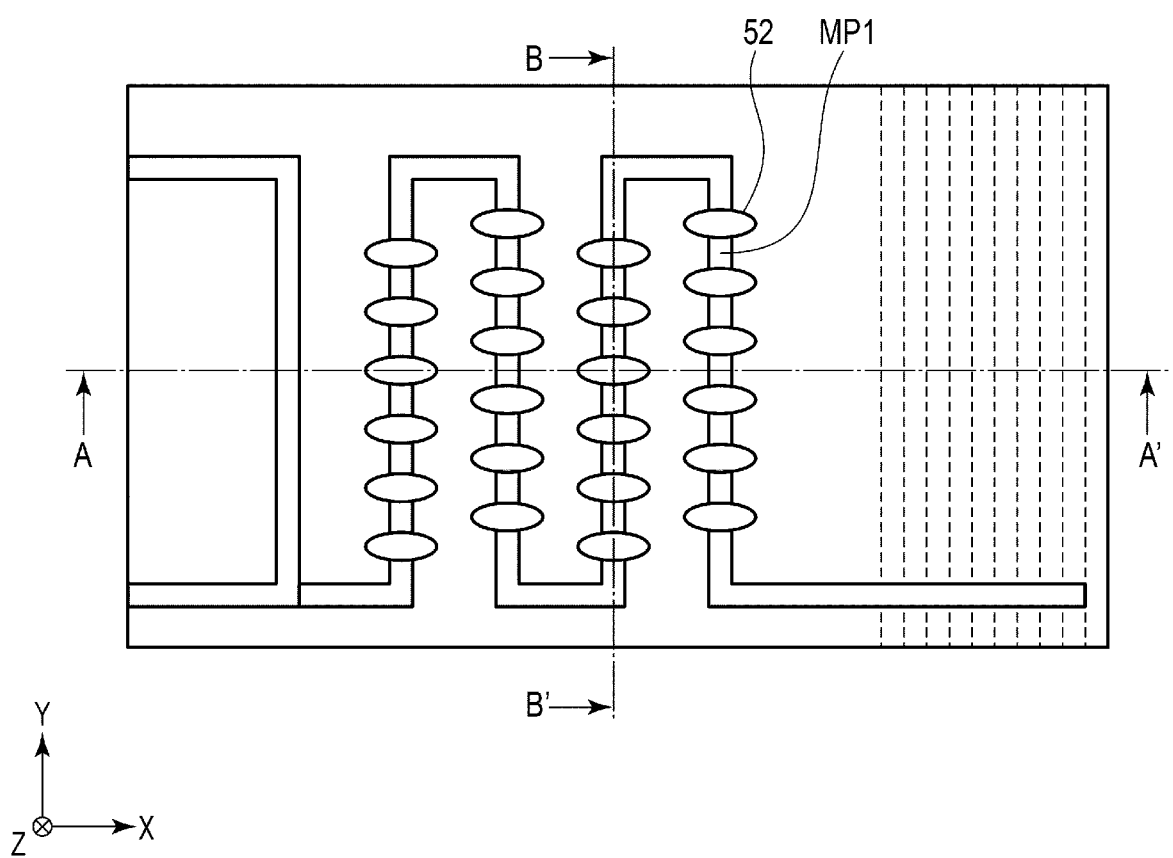
FIG. 13A is a plan view of a structure formed in manufacturing a semiconductor memory device according to an embodiment.
Figure 13C:
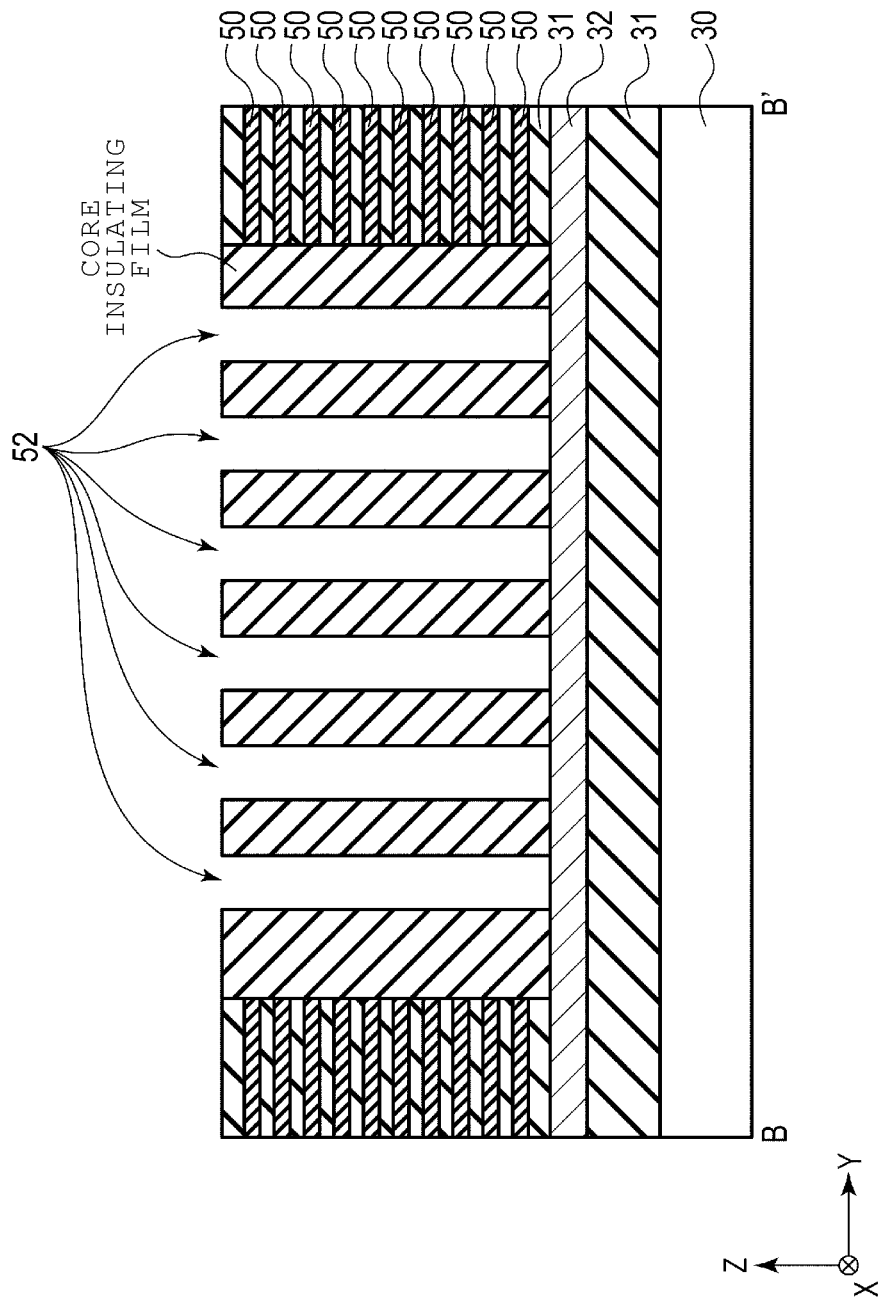
FIG. 13C is a cross-sectional view taken along line B-B' in FIG. 13A of a structure formed in manufacturing a semiconductor memory device according to an embodiment.

Next, as illustrated in FIGS. 13A to 13C, holes 52 for dividing the memory pillar MP1 formed in the trench 51 are formed. Specifically, as illustrated in FIGS. 13A to 13C, the holes 52 for dividing the memory pillar MP1 formed in the trench 51 at predetermined intervals are formed by, for example, RIE. The holes 52 may have, for example, an oval shape, a circular shape, a rectangular shape, or the like. Here, a case in which the holes 52 have an oval shape will be described.

Figure 14A:
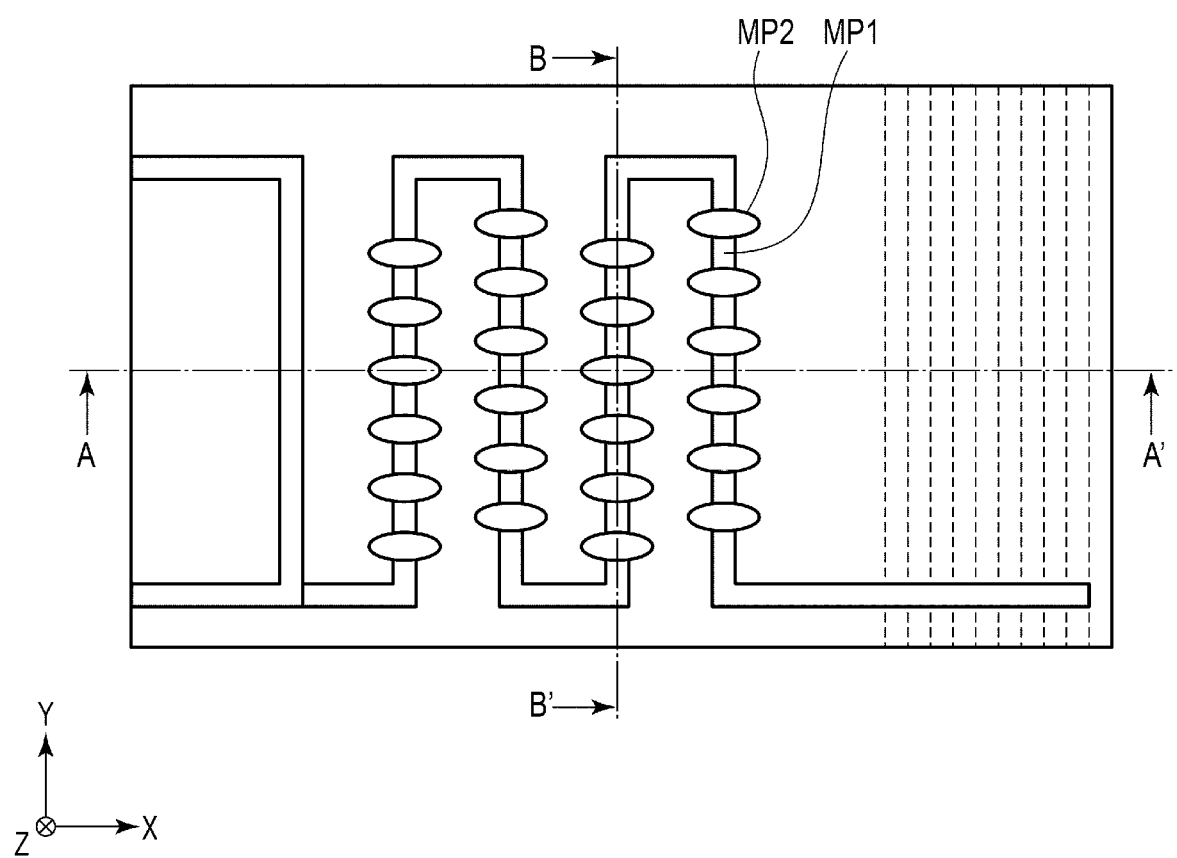
FIG. 14A is a plan view of a structure formed in manufacturing a semiconductor memory device according to an embodiment.
Figure 14B:
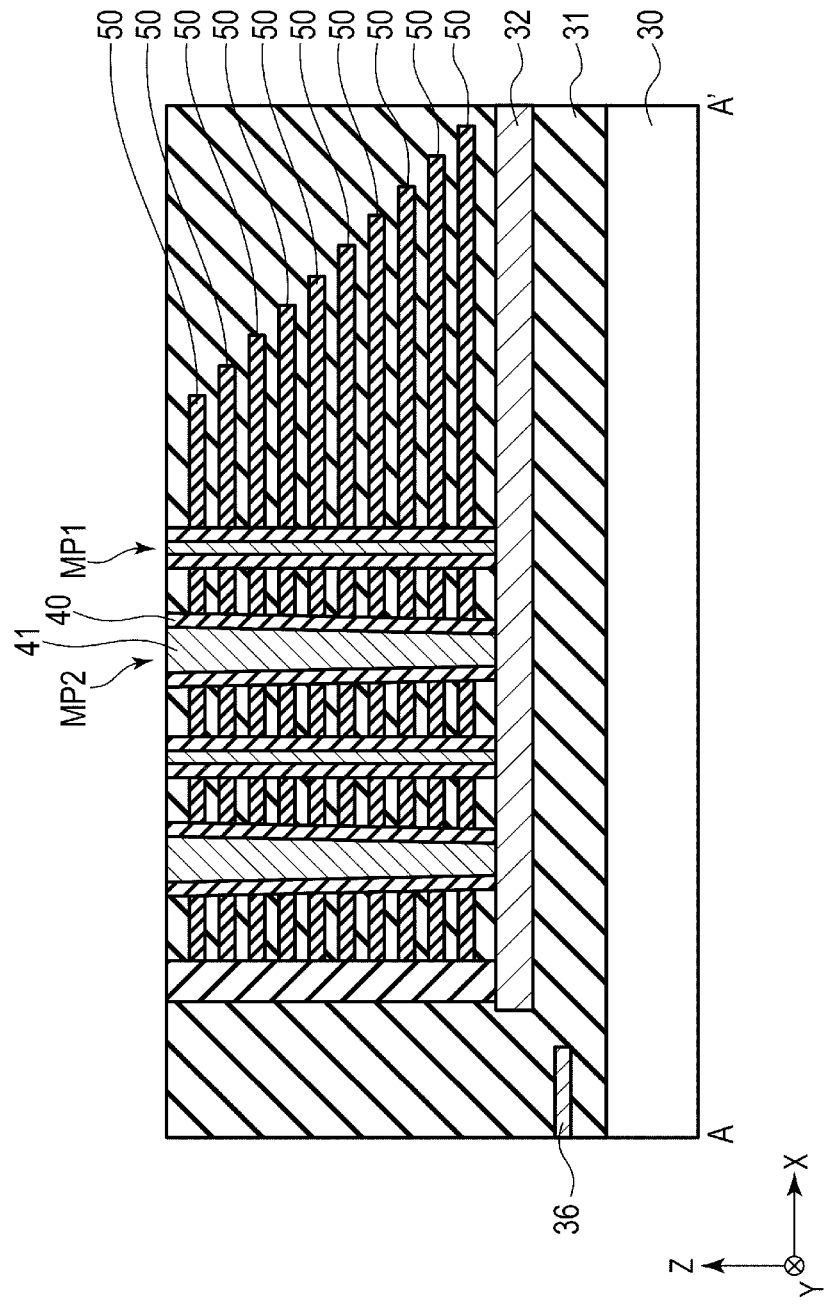
FIG. 14B is a cross-sectional view taken along line A-A' in FIG. 14A of a structure formed in manufacturing a semiconductor memory device according to an embodiment.
Figure 14C:
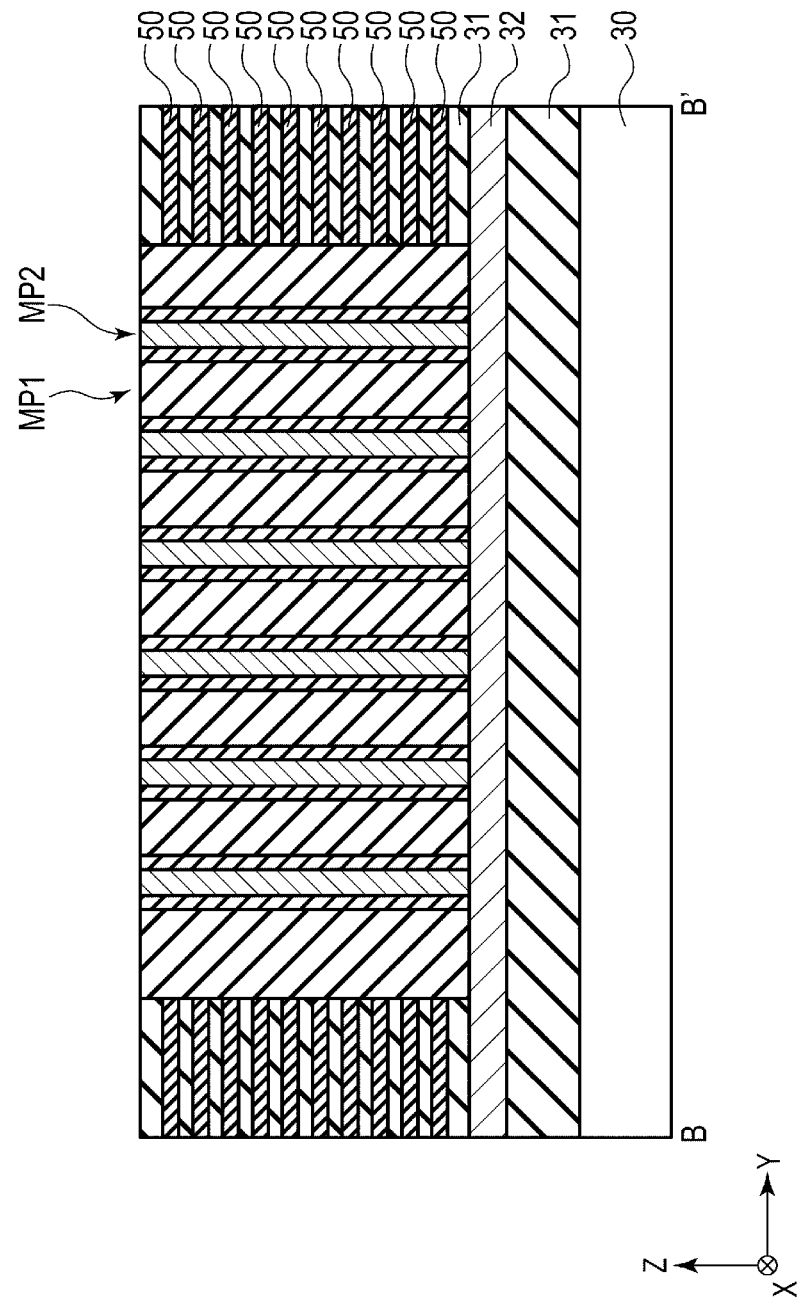
FIG. 14C is a cross-sectional view taken along line B-B' in FIG. 14A of a structure formed in manufacturing a semiconductor memory device according to an embodiment.

Next, as illustrated in FIGS. 14A to 14C, a memory pillar MP2 is formed in each of the holes 52 for diving the memory pillar MP1. Specifically, a cell insulating film 40 and a semiconductor layer 41 are sequentially formed on a side wall of the hole 52 to form the memory pillar MP2. A method of forming the memory pillar MP2 will be described in detail below.

Figure 15A:
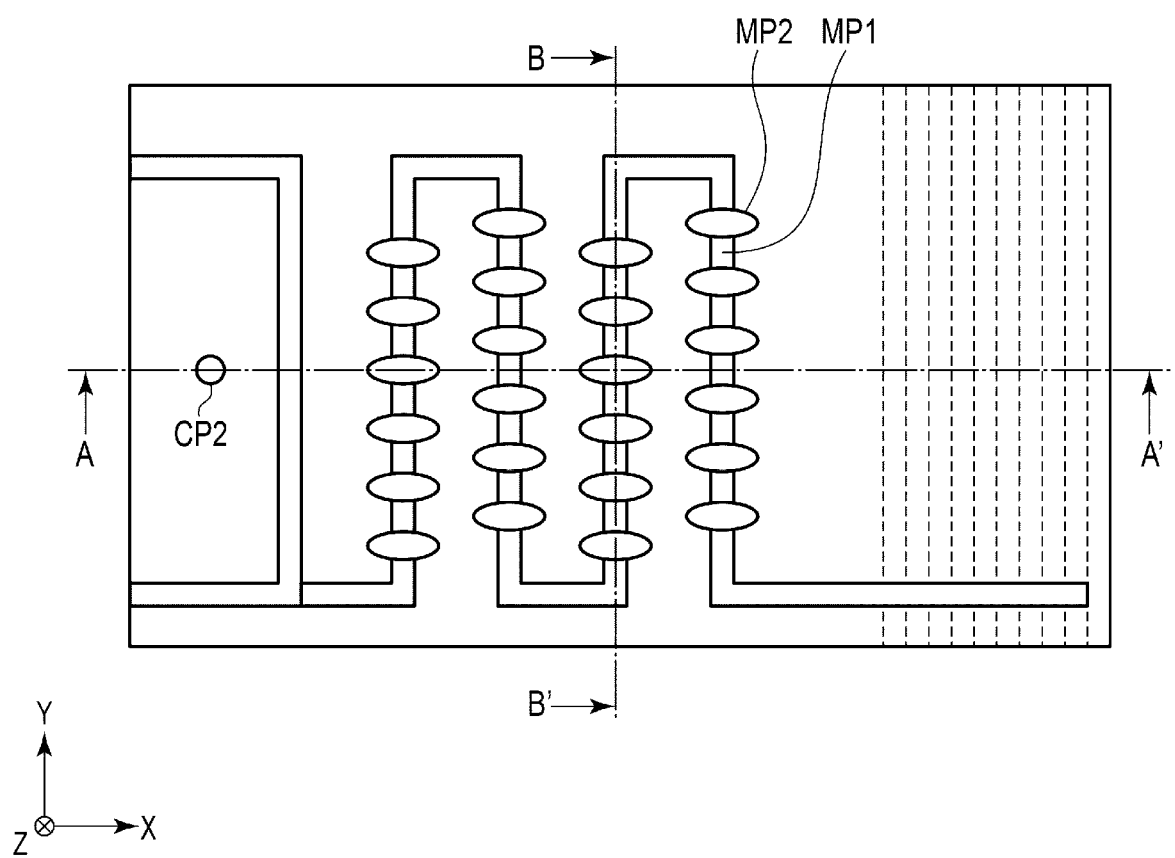
FIG. 15A is a plan view of a structure formed in manufacturing a semiconductor memory device according to an embodiment.
Figure 15B:
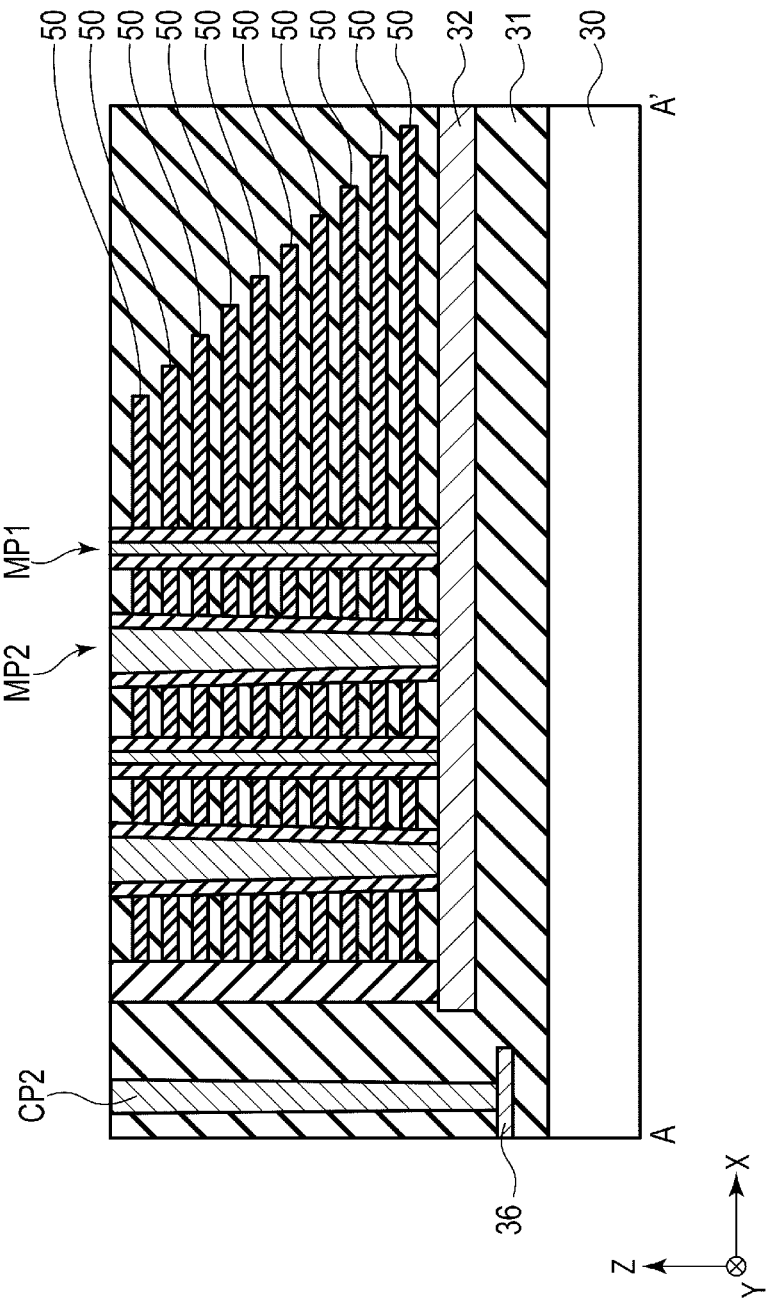
FIG. 15B is a cross-sectional view taken along line A-A' in FIG. 15A of a structure formed in manufacturing a semiconductor memory device according to an embodiment.
Figure 15C:
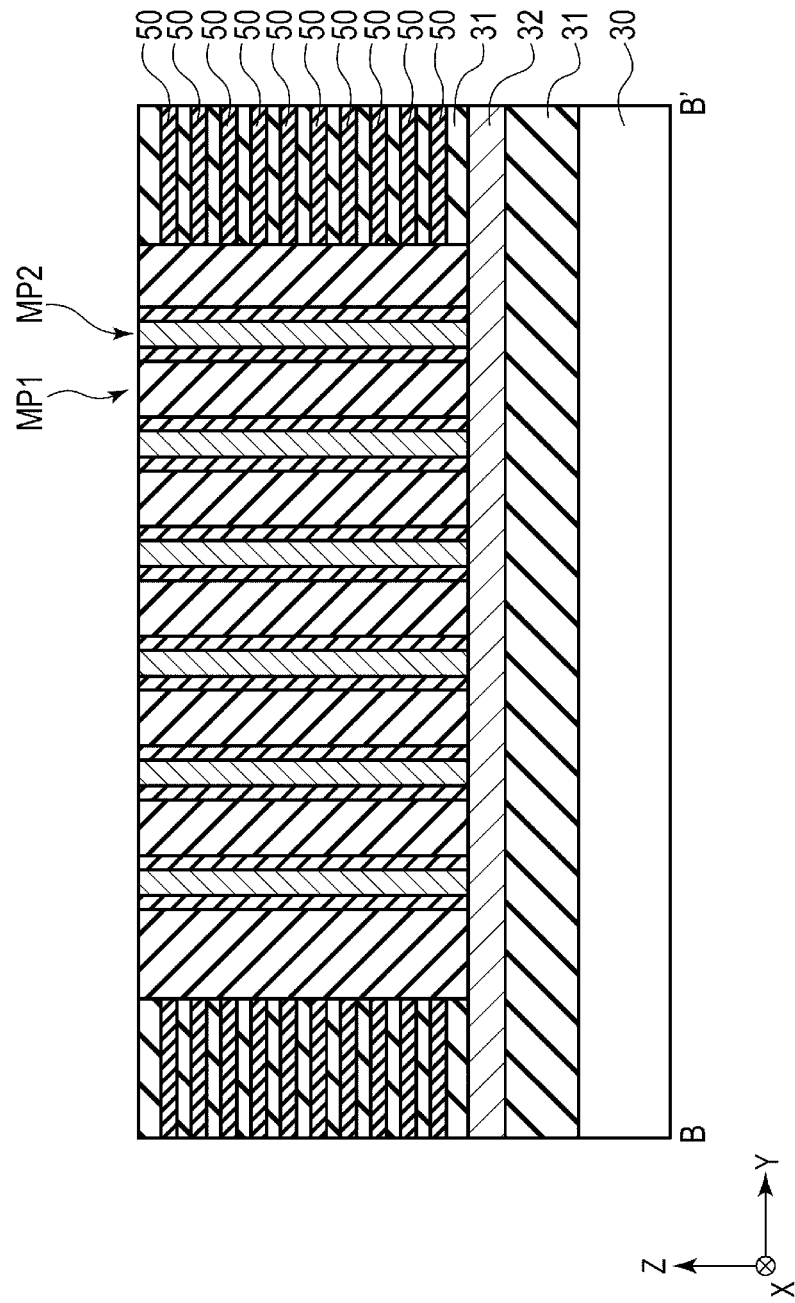
FIG. 15C is a cross-sectional view taken along line B-B' in FIG. 15A of a structure formed in manufacturing an semiconductor memory device according to an embodiment.

Next, as illustrated in FIGS. 15A to 15C, a contact plug CP2 is formed in the contact region 300.

Figure 16A:
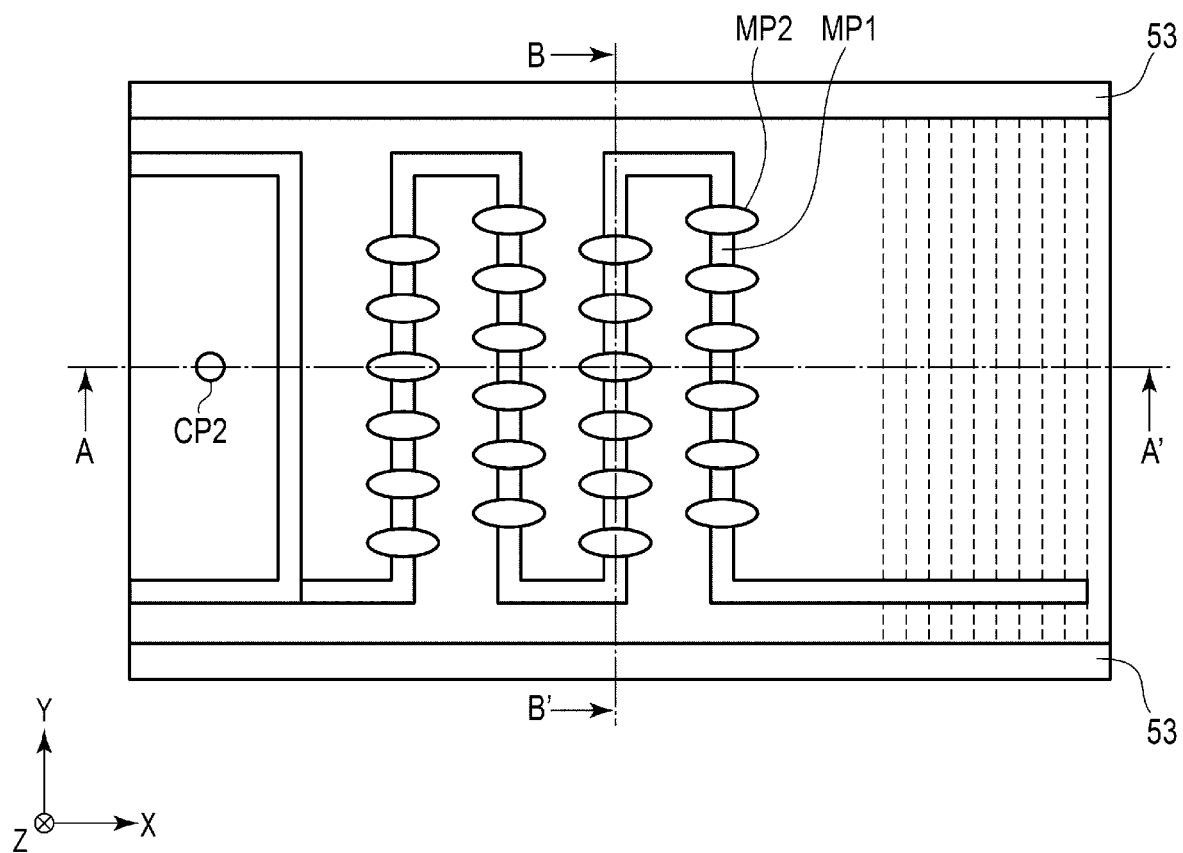
FIG. 16A is a plan view of a structure formed in manufacturing a semiconductor memory device according to an embodiment.
Figure 16B:
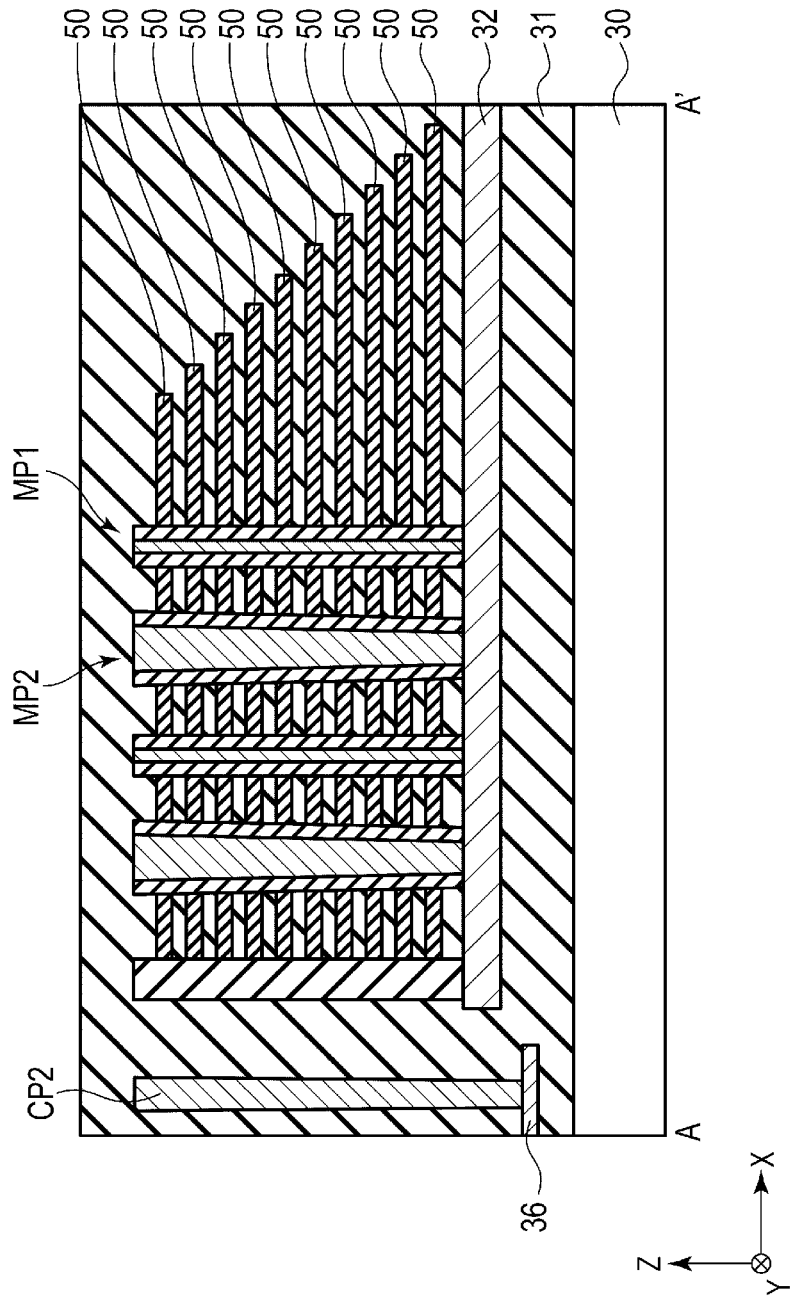
FIG. 16B is a cross-sectional view taken along line A-A' in FIG. 16A of a structure formed in manufacturing a semiconductor memory device according to an embodiment.
Figure 16C:
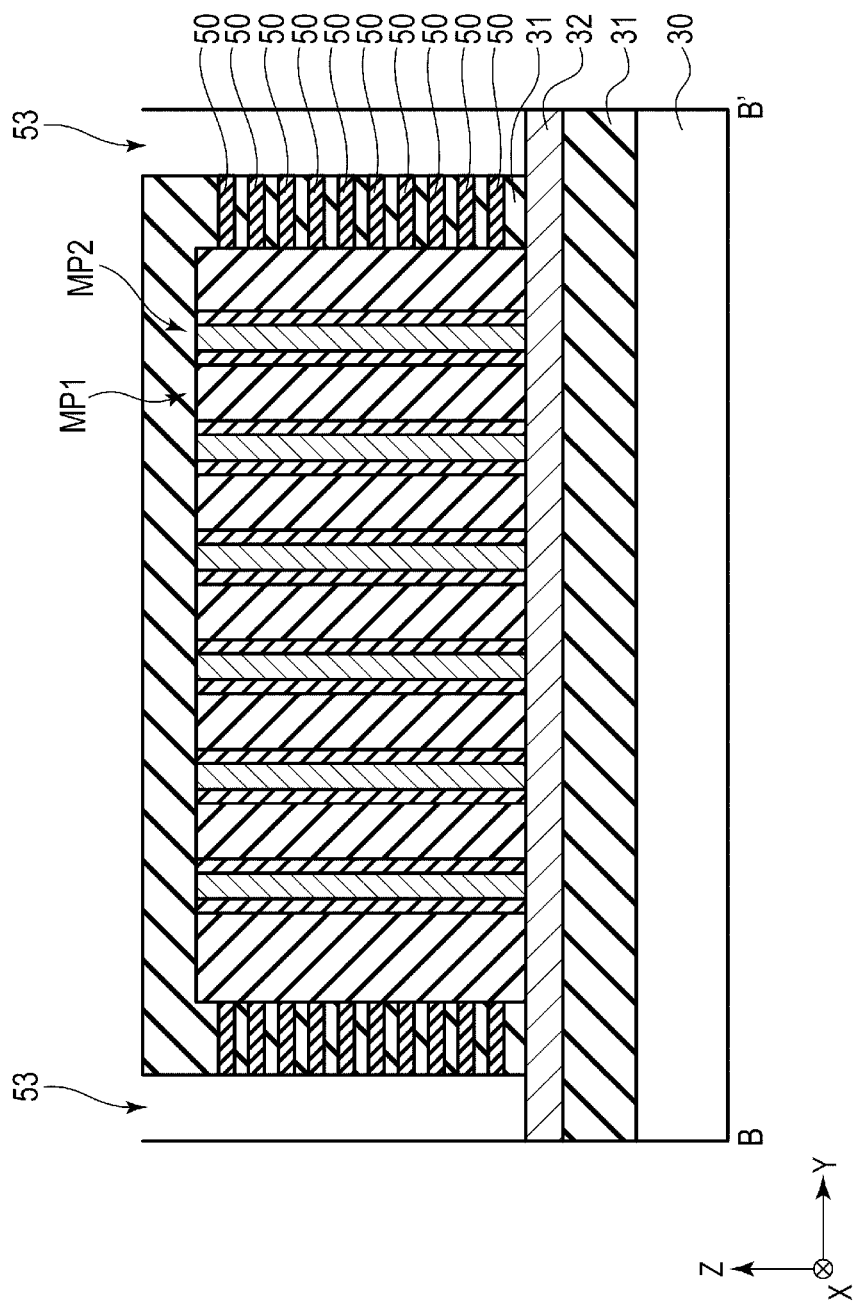
FIG. 16C is a cross-sectional view taken along line B-B' in FIG. 16A of a structure formed in manufacturing a semiconductor memory device according to an embodiment.
Figure 17A:
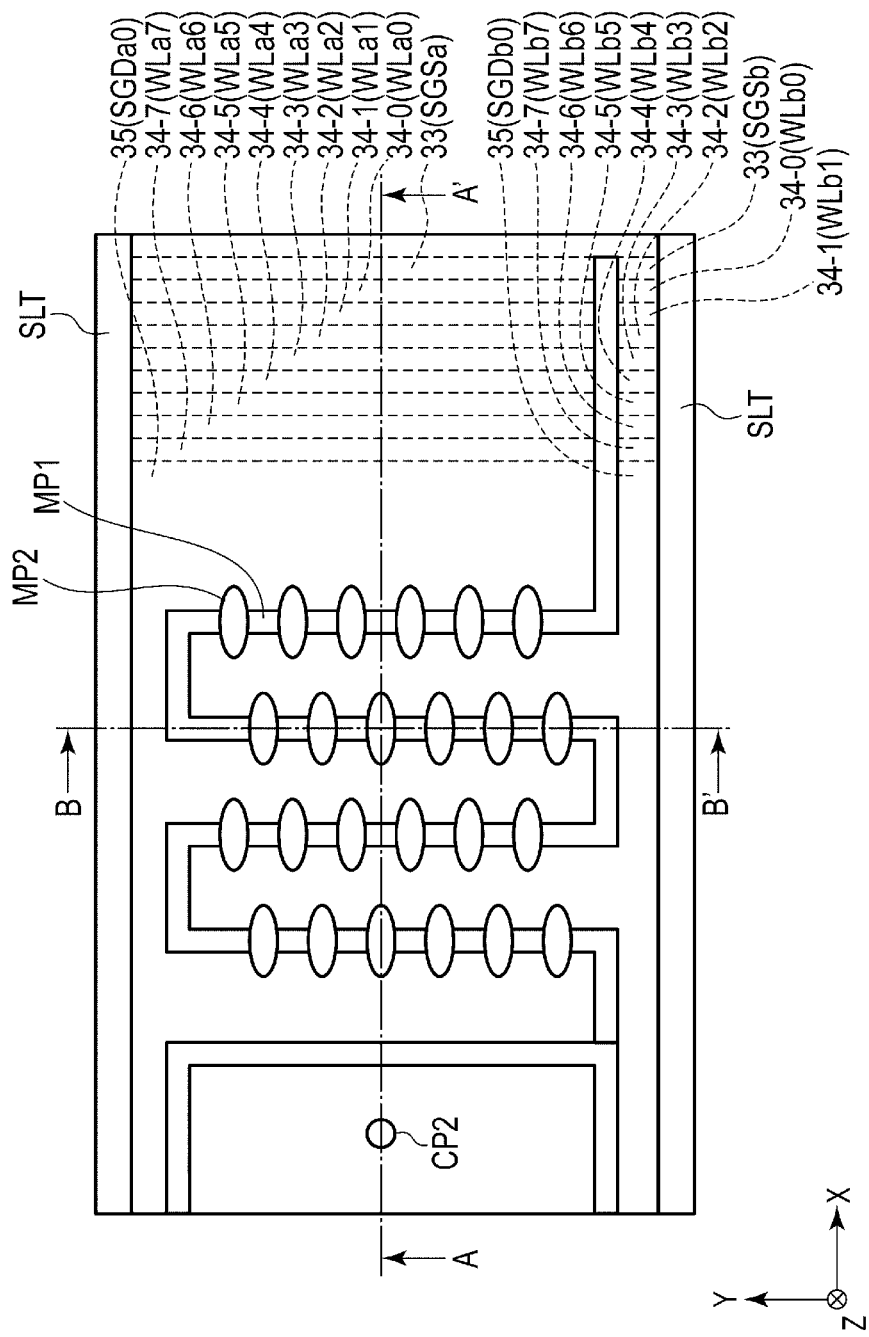
FIG. 17A is a plan view of a structure formed in manufacturing a semiconductor memory device according to an embodiment.
Figure 17B:
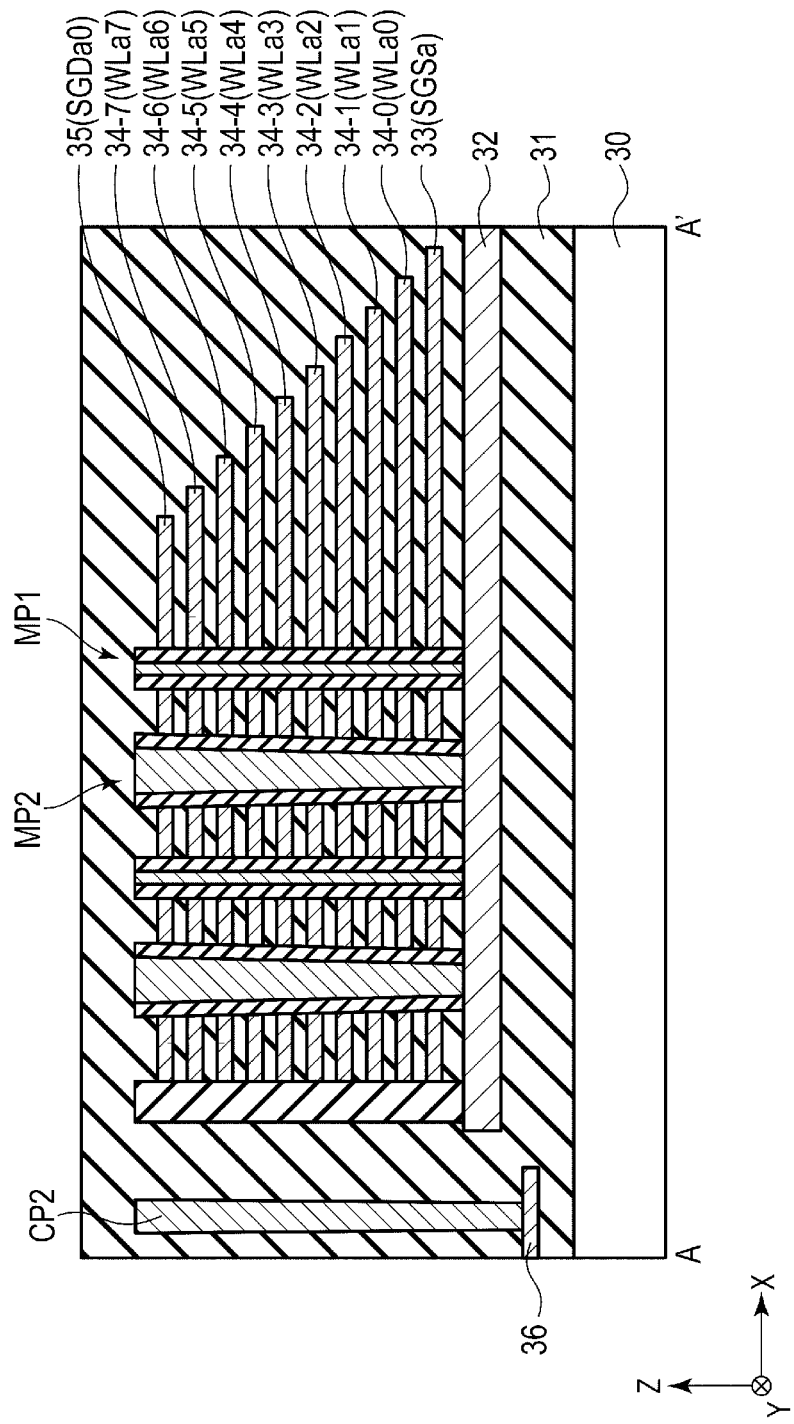
FIG. 17B is a cross-sectional view taken along line A-A' in FIG. 17A of a structure formed in manufacturing a semiconductor memory device according to an embodiment.

Next, as illustrated in FIGS. 16A to 16C and 17A to 17C, the insulating layers (silicon nitride layers) 50 are replaced with conductive layers 33, 34-0 to 34-7, and 35, and slits SLT for dividing the conductive layers 33, 34-0 to 34-7, and 35 are formed. Specifically, as illustrated in FIGS. 16A to 16C, after the insulating layer 31 is formed on the whole surface thereof, grooves 53 for the slits SLT are formed by, for example, RIE in the insulating layer 31 and the stacked body including the insulating layers 31 and the insulating layers 50. The grooves 53 are formed to extend in the X-axis direction on both side surfaces of the stacked body in the Y-axis direction to reach the conductive layer 32 from a surface of the insulating layer 31. Next, the insulating layers (silicon nitride layers) 50 are removed via the grooves 53 by, for example, wet etching using a phosphoric acid solution. The insulating layers (silicon oxide layers) 31 are not removed by the wet etching but remain. As a result, empty spaces are formed between the insulating layers 31. Furthermore, as illustrated in FIGS. 17A to 17C, the empty spaces between the insulating layers 31 are filled with a conductive material, for example, tungsten by CVD or ALD to form the conductive layers 33, 34-0 to 34-7, and 35. Thereafter, the conductive material remaining on the inner surfaces of the groove 53 are removed and an insulating material, for example, a silicon oxide layer is filled in the grooves 53 by, for example, CVD or ALD. Accordingly, the slits SLT are formed.

Figure 18A:
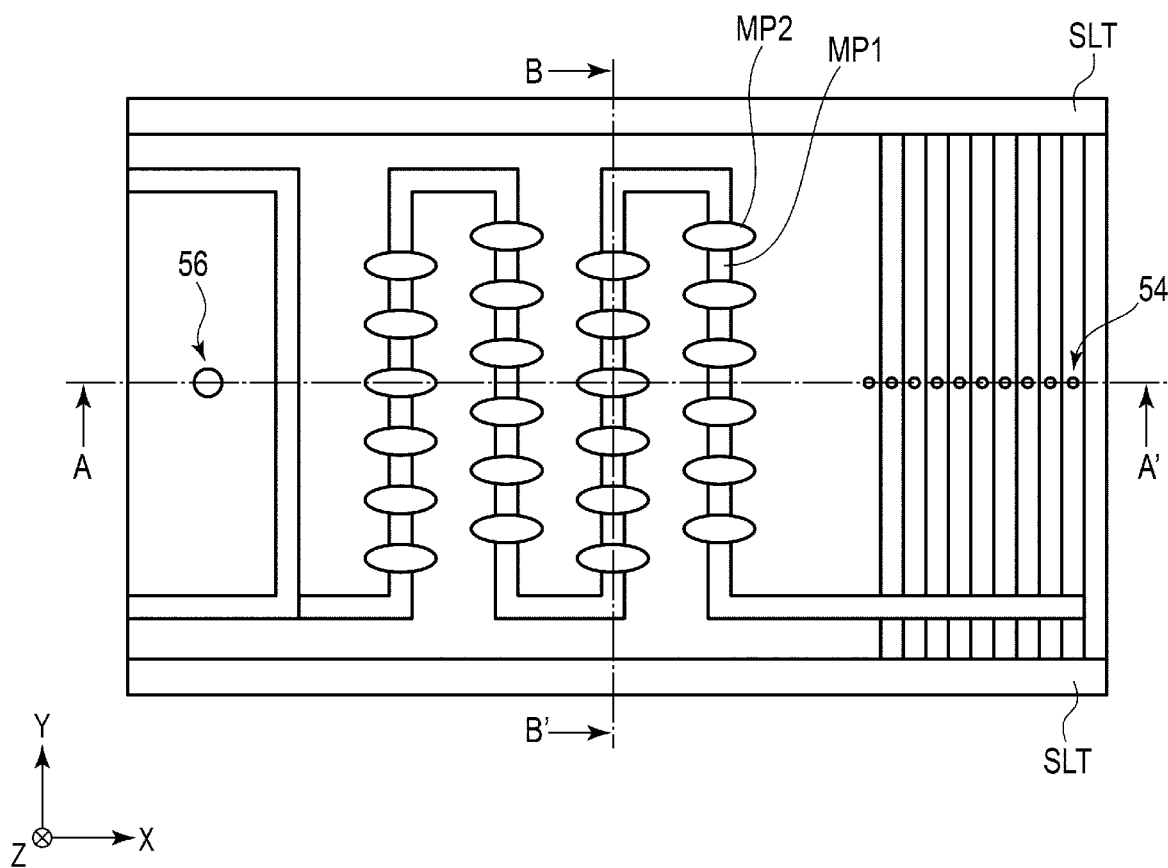
FIG. 18A is a plan view of a structure formed in manufacturing a semiconductor memory device according to an embodiment.
Figure 18B:
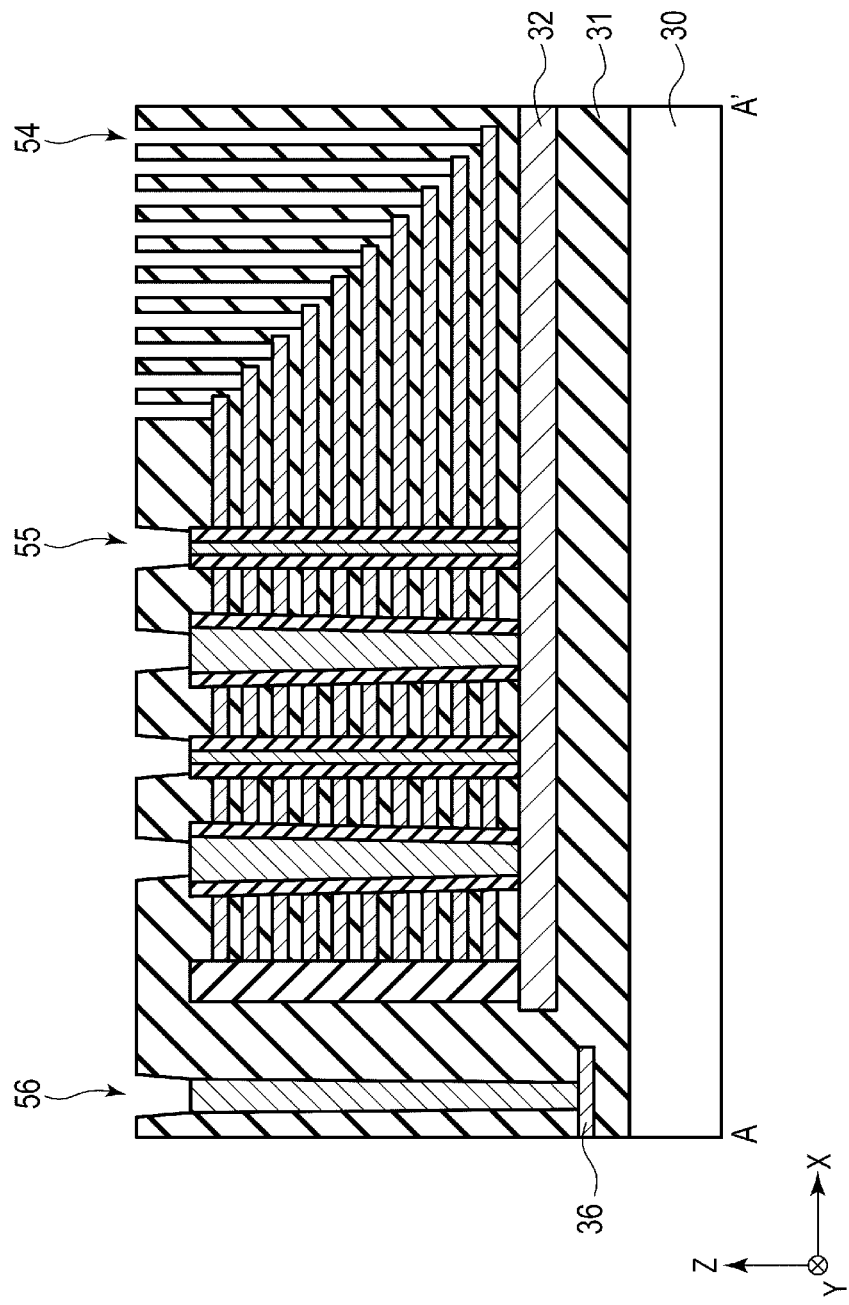
FIG. 18B is a cross-sectional view taken along line A-A' in FIG. 18A of a structure formed in manufacturing a semiconductor memory device according to an embodiment.
Figure 18C:
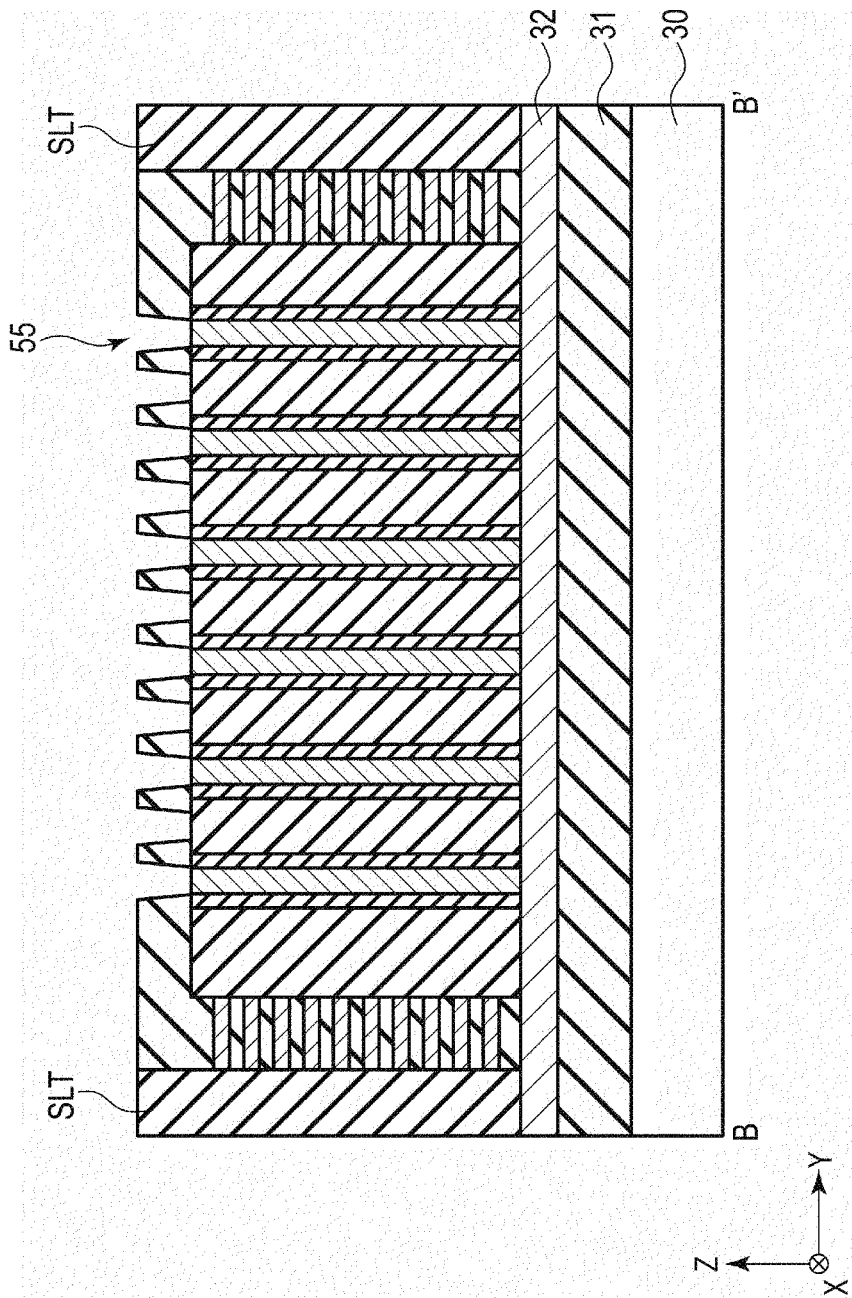
FIG. 18C is a cross-sectional view taken along line B-B' in FIG. 18A of a structure formed in manufacturing a semiconductor memory device according to an embodiment.

Next, as illustrated in FIGS. 18A to 18C and FIGS. 3 to 5, contact plugs CP1 and CP3 are formed. Specifically, as illustrated in FIGS. 18A to 18C, holes 54 for the contact plugs CP1 are formed in the insulating layer 31 on the drawn-out region of the conductive layers 33, 34-0 to 34-7, and 35, holes 55 for the contact plugs CP3 are formed in the insulating layer 31 on the memory pillars MP1 and MP2, and a hole 56 for the contact plug CP4 is formed in the insulating layer 31 on the contact plug CP2 by, for example, RIE. Next, a conductive material, for example, tungsten is filled in the holes 54 to 56 by, for example, CVD or ALD as illustrated in FIGS. 3 to 5. Accordingly, the contact plugs CP1 are formed on the drawn-out region of the conductive layers 33, 34-0 to 34-7 and 35, the contact plugs CP 3 are formed on the memory pillars MP1 and MP2, and the contact plug CP4 is formed on the contact plug CP2.

Thereafter, bit lines BL, other wirings, vias, insulating layers, and the like are formed, and the manufacturing of the semiconductor memory device is completed.

2. 1 Method of Forming Memory Pillars MP1 and MP2

Next, a method of forming the memory pillars MP1 and MP2 will be described with reference to FIGS. 19 to 24.

Figure 19:
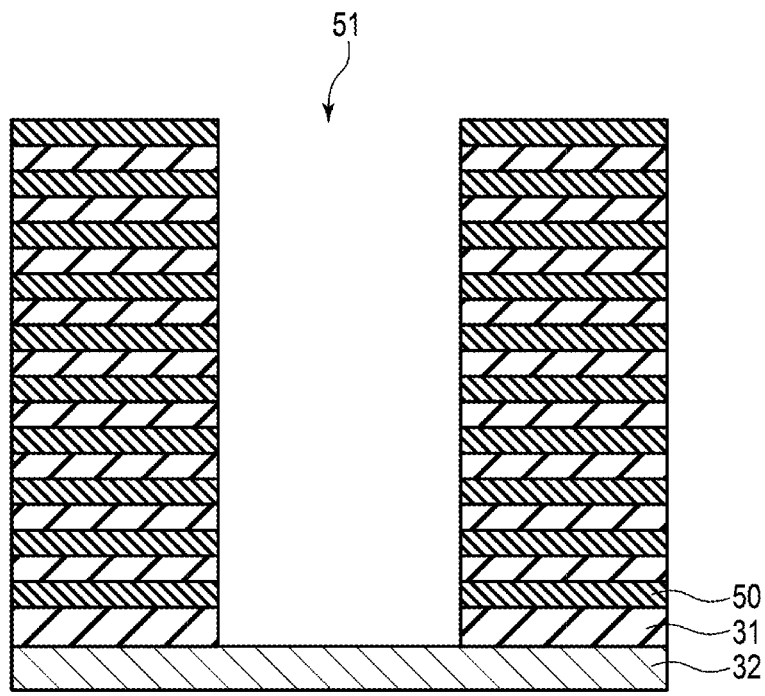
FIG. 19 is a cross-sectional view of a structure formed in making a first memory pillar according to an embodiment.
Figure 20:
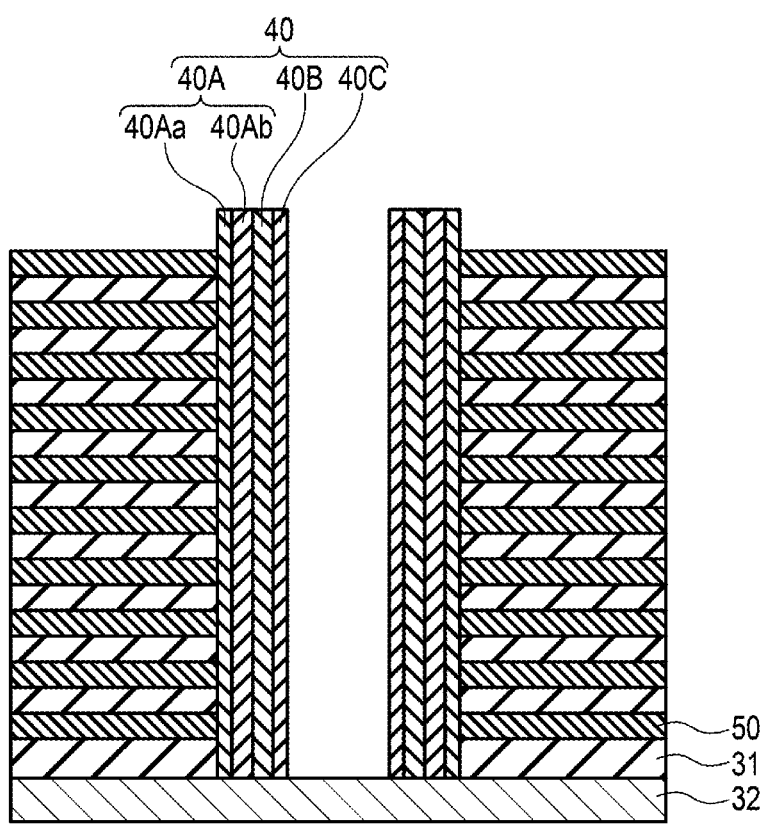
FIG. 20 is a cross-sectional view of the structure formed in making a first memory pillar according to an embodiment.
Figure 21:
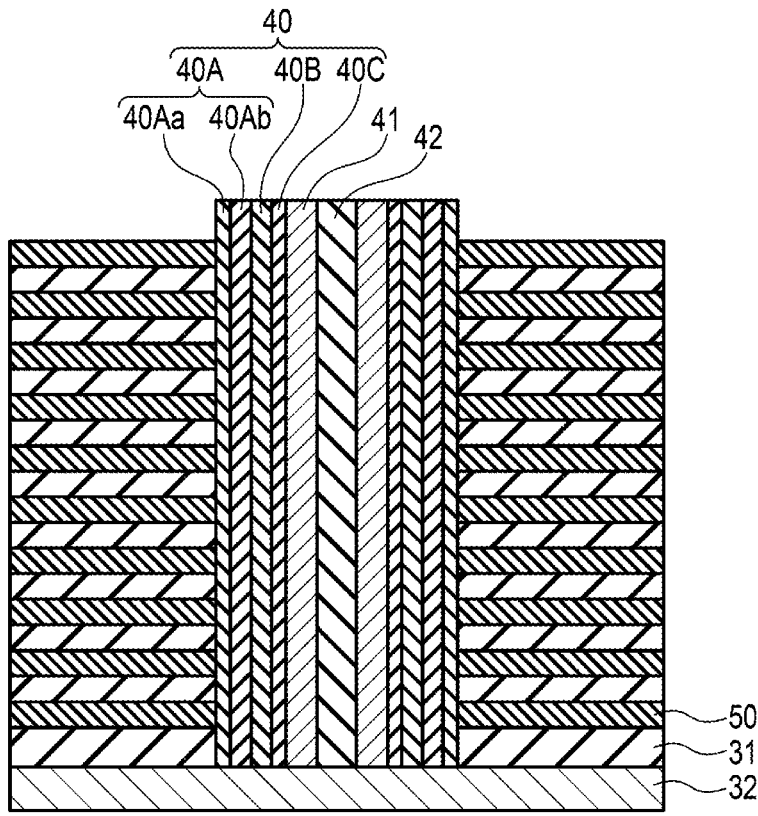
FIG. 21 is a cross-sectional view of the structure formed in making a first memory pillar according to an embodiment.

A method of forming the memory pillar MP1 will be described below. FIGS. 19 to 21 are cross-sectional views of structures formed in each of processes illustrating the method of forming the memory pillar MP1.

As illustrated in FIG. 19, the trench 51 is formed in the stacked body of the insulating layers 31 and the insulating layers 50 by RIE as described above with reference to FIGS. 11A to 11C.

Next, as illustrated in FIG. 20, an aluminum oxide film 40Aa, a silicon oxide film 40Ab, a charge storage film 40B, and a tunnel insulating film 40C are sequentially formed on the inner wall of the trench 51 by, for example, CVD or ALD. The aluminum oxide film 40Aa and the silicon oxide film 40Ab form the block insulating film 40A together.

Next, as illustrated in FIG. 21, for example, by CVD or ALD, a semiconductor layer 41 is formed on an inner wall of the tunnel insulating film 40C and a core insulating layer 42 is formed on an inner wall of the semiconductor layer 41. Accordingly, the formation of the memory pillar MP1 is completed.

Alternatively, the aluminum oxide film 40Aa and the silicon oxide film 40Ab which constitute the block insulating film 40A may be formed by a method different from that described above. First, as illustrated in FIG. 19, after the trench 51 is formed in the stacked body, the insulating layers (silicon nitride layers) 50 exposed to the inner wall of the trench 51 is oxidized. As a result, the silicon oxide film 40Ab is formed on exposed portions of the insulating layer 50 to the trench 51. Here, when a film thickness of the silicon oxide film 40Ab formed by the oxidation is insufficient, a silicon oxide film is further deposited on a side surface of the silicon oxide film 40Ab by CVD or ALD. Next, similarly, the charge storage film 40B, the tunnel insulating film 40C, the semiconductor layer 41, and the core insulating film 42 are sequentially formed on the inner wall of the silicon oxide film 40Ab. Thereafter, a process of replacing the insulating layers 50 in the stacked body with conductive layers is performed. In the process, when the insulating layers 50 are removed to form empty spaces, the silicon oxide film 40Ab is exposed to the front ends of the empty spaces extending toward the memory pillar MP1. Next, the aluminum oxide film 40Aa is formed on a side surface of the exposed silicon oxide film 40Ab. Accordingly, the aluminum oxide film 40Aa as the block insulating film 40A is formed between the silicon oxide film 40Ab and the conductive layers. In this way, the characteristics of the memory cell transistors can be improved by forming the silicon oxide film 40Ab by oxidizing the insulating layers 50.

Figure 22:
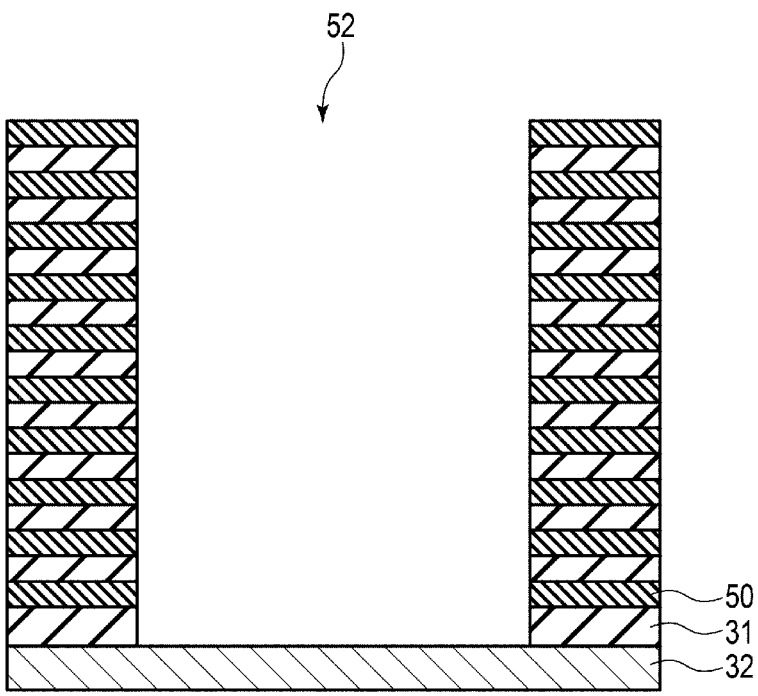
FIG. 22 is a cross-sectional view of a structure formed in making a second memory pillar according to an embodiment.
Figure 23:
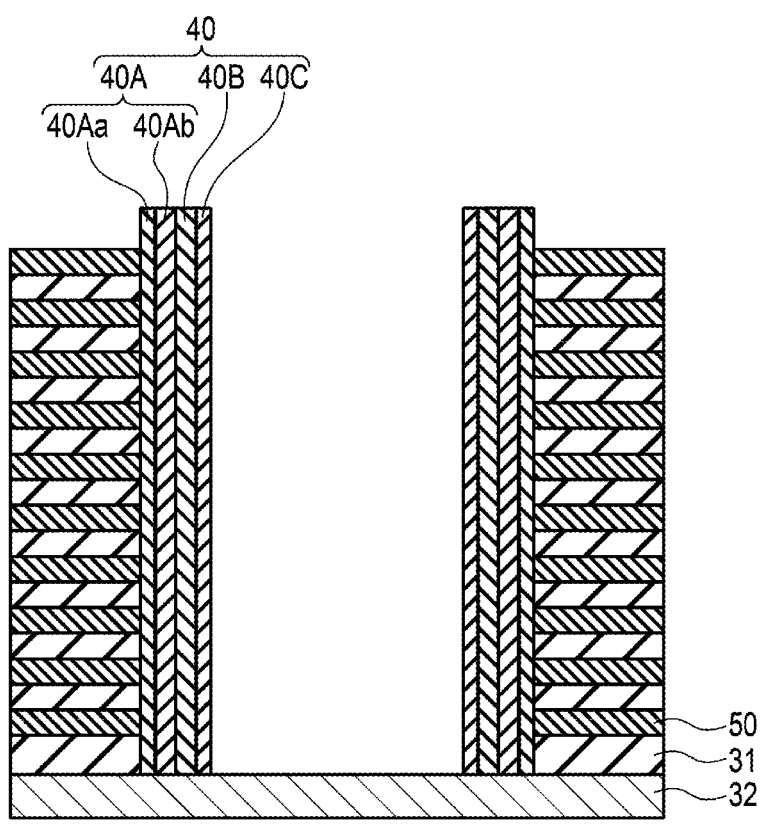
FIG. 23 is a cross-sectional view of the structure formed in making a first memory pillar according to an embodiment.
Figure 24:
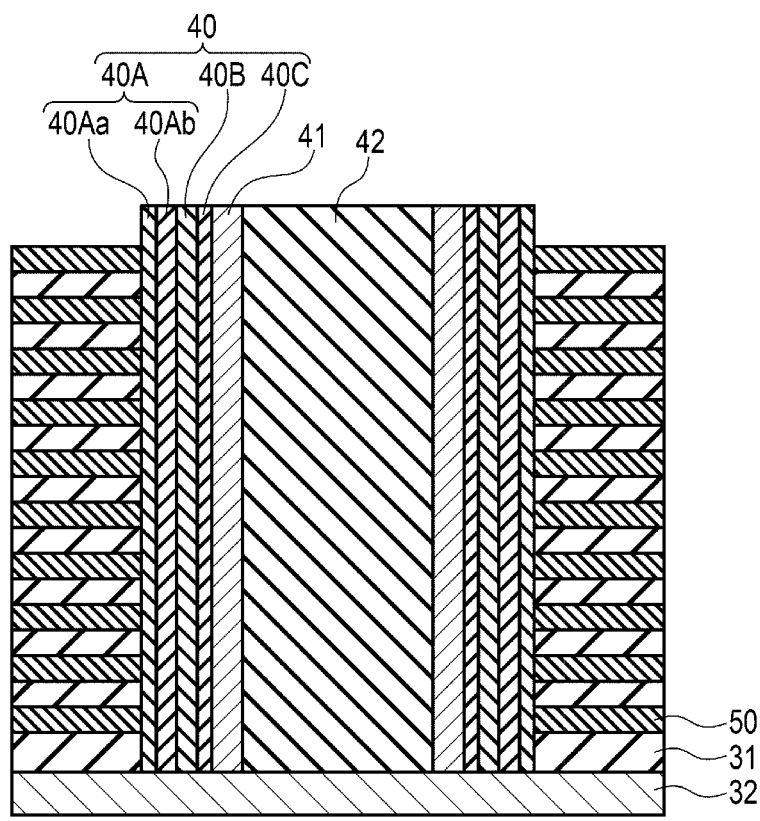
FIG. 24 is a cross-sectional view of a structure formed in making a second memory pillar according to an embodiment.

Next, a method of forming the memory pillar MP2 will be described. FIGS. 22 to 24 are cross-sectional views of structures formed in each of the processes illustrating the method of forming the memory pillar MP2.

After the memory pillar MP1 is formed in the trench 51 as described above with reference to FIGS. 12A to 12C, the hole 52 for dividing the memory pillar MP1 formed in the trench 51 are formed by RIE as illustrated in FIG. 22. Thereafter, as illustrated in FIG. 23, an aluminum oxide film 40Aa, a silicon oxide film 40Ab, a charge storage film 40B, and a tunnel insulating film 40C are sequentially formed on the inner wall of the hole 52 by CVD or ALD, similar to the memory pillar MP1. Next, as illustrated in FIG. 24, a semiconductor layer 41 and a core insulating layer 42 are sequentially formed on the inner wall of the tunnel insulating film 40C in the hole 52 by CVD or ALD. Accordingly, the formation of the memory pillar MP2 is completed.

The other method of forming the aluminum oxide film 40Aa and the silicon oxide film 40Ab in the memory pillar MP1 described above is also applicable to the formation of the aluminum oxide film 40Aa and the silicon oxide film 40Ab of the memory pillar MP2.

3. Effects of Embodiment

According to the present embodiment, a semiconductor memory device capable of high integration of memory cells is provided. Furthermore, the characteristics of the memory cells can be improved.

Next, effects of an embodiment will be described in detail. In a comparative example, a memory trench for dividing a plurality of word lines and a plurality of selection gate lines is formed, and a memory function film is deposited in the memory trench. Thereafter, an insulating region for dividing the memory trench is formed, and memory pillars for memory cells are formed. As a result, a structure in which semiconductor layers of the memory pillars are separated by the insulating region is obtained. In such a structure, it is necessary to divide a plurality of stacked word lines and a plurality of stacked selection gate lines with an insulating region and thus the insulating region is required to have a relatively large area. Accordingly, it may be difficult to highly integrate memory cells (or memory pillars).

However, in the present embodiment, the insulating region the memory trench MT in which the memory pillar MP1 is provided is not merely as an insulating region but further includes the memory pillar MP2 formed within the insulating region. Thus, the insulating region is used not exclusively as a region for insulating between the arranged memory pillars MP1 but also as another memory cell transistor region. As a result, the memory pillars (or memory cells) can be arranged at a higher density, thereby achieving greater integration of memory cells.

In addition, in the comparative example as described above, when a write voltage is applied to a memory cell, an electric field is generated in the exclusively insulating region existing at an end portion of the memory cell. The electric field generated at the end portion of the memory cell will be referred to as a fringe electric field. The electric field concentrates at the end portion of the memory cell close to a portion in which the memory cell and the insulating region contact to each other more than at a central portion of the memory cell due to the fringe electric field, and thus, a threshold voltage of the memory cell cannot be increased.

Figure 25:
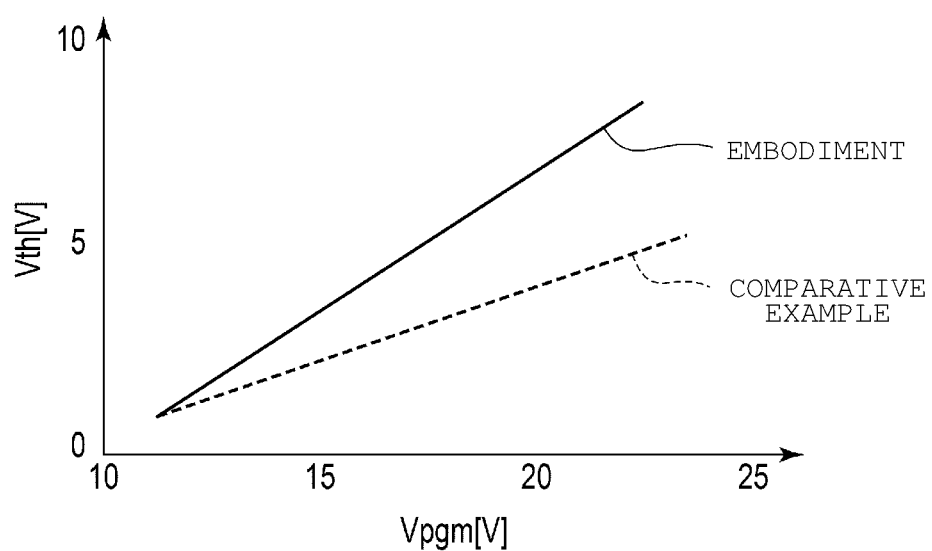
FIG. 25 is a diagram depicting write characteristics of a flat cell according to an embodiment.

However, in the present embodiment, a circular cell CC is arranged to be in contact with a flat cell FC. Thus, an influence of the fringe electric field at an end portion of the flat cell FC is reduced by a shielding effect due to the channel of the circular cell CC. As a result, as illustrated in FIG. 25, a slope of a rise in a threshold voltage can be increased due to a write voltage Vpgm. Accordingly, write characteristics of the flat cell FC can be improved.

Since the slope of the rise in the threshold voltage due to the write voltage Vpgm is large, the flat cell FC can be used as, for example, an SLC, an MLC, a TLC, or a memory cell capable of storing more bits than the SLC, the MLC, or the TLC.

As described above, in the semiconductor memory device according to the present embodiment, it is possible to achieve higher integration of memory cells and to increase the storage capacity. Furthermore, the write characteristics of memory cells can be improved.

4. Other Modified Examples

While certain embodiments have been described above, these embodiments have been presented by way of example only, and are not intended to limit the scope of the present disclosure. Indeed, the novel embodiments described herein may be embodied in a variety of other forms; furthermore, various omissions, substitutions, and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
   a plurality of first conductive layers stacked in a first direction;
   a plurality of second conductive layers stacked in the first direction and spaced from the plurality of first conductive layers in a second direction intersecting the first direction;
   a first memory pillar between the plurality of first conductive layers and the plurality of second conductive layers in the second direction, the first memory pillar extending in the first direction, having a first length in the second direction, and including a first semiconductor layer extending in the first direction, a first charge storage film, between the first semiconductor layer and the plurality of first conductive layers, and a second charge storage film, between the first semiconductor layer and the plurality of second conductive layers; and
   a second memory pillar between the plurality of first conductive layers and the plurality of second conductive layers in the second direction, the second memory pillar being adjacent to the first memory pillar, extending in the first direction, having a second length greater than the first length in the second direction, and including a second semiconductor layer extending in the first direction and a third charge storage film.

2. The semiconductor memory device according to claim 1, wherein
   the plurality of first conductive layers includes a first linear portion,
   the plurality of second conductive layers includes a second linear portion, and
   the first memory pillar is between the first linear portion and the second linear portion.

3. The semiconductor memory device according to claim 2, wherein
   the first linear portion and the second linear portion extend in a third direction intersecting the first direction and the second direction and
   the first linear portion and the second linear portion are opposed to each other.

4. The semiconductor memory device according to claim 1, wherein
   the plurality of first conductive layers includes a first curved portion,
   the plurality of second conductive layers includes a second curved portion, and
   the second memory pillar is between the first curved portion and the second curved portion.

5. The semiconductor memory device according to claim 4, wherein
   the first curved portion and the second curved portion each have an arc shape.

6. The semiconductor memory device according to claim 1, wherein
   an outer circumference of a cross section, taken perpendicular to the first direction, of the first memory pillar has a rectangular shape, and
   an outer circumference of a cross section, taken perpendicular to the first direction, of the second memory pillar has an elongated circular shape.

7. The semiconductor memory device according to claim 1, wherein
   an outer circumference of a cross section, taken perpendicular to the first direction, of the first semiconductor layer has a rectangular shape, and
   an outer circumference of a cross section, taken perpendicular to the first direction, of the second semiconductor layer has an elongated circular shape.

8. The semiconductor memory device according to claim 1, wherein
   the first memory pillar and the second memory pillar each comprise a first silicon oxide film, a silicon nitride film, and a second silicon oxide film, which are sequentially provided from the plurality of first conductive layers.

9. The semiconductor memory device according to claim 1, wherein
   the first memory pillar and the second memory pillar each further include a block insulating film and a tunnel insulating film.

10. The semiconductor memory device according to claim 1, further comprising:
    a plurality of first memory pillars and a plurality of second memory pillars alternately arranged.

11. The semiconductor memory device according to claim 1, wherein the third charge storage film surrounds the second semiconductor layer.

* * * * *